(12) United States Patent
Inaba et al.

(10) Patent No.: US 7,759,679 B2
(45) Date of Patent: Jul. 20, 2010

(54) SOLID-STATE IMAGING DEVICE, MANUFACTURING METHOD OF SOLID-STATE IMAGING DEVICE, AND CAMERA EMPLOYING SAME

(75) Inventors: Yuuichi Inaba, Moriguchi (JP); Masahiro Kasano, Takatsuki (JP); Shinji Yoshida, Takatsuki (JP); Takumi Yamaguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 900 days.

(21) Appl. No.: 10/536,962

(22) PCT Filed: Sep. 13, 2004

(86) PCT No.: PCT/JP2004/013700

§ 371 (c)(1),
(2), (4) Date: Apr. 6, 2006

(87) PCT Pub. No.: WO2005/069376

PCT Pub. Date: Jul. 28, 2005

(65) Prior Publication Data

US 2006/0205107 A1    Sep. 14, 2006

(30) Foreign Application Priority Data

Jan. 15, 2004 (JP) .............................. 2004-008419
Jun. 28, 2004 (JP) .............................. 2004-189191

(51) Int. Cl.
*H01L 29/10* (2006.01)
(52) U.S. Cl. .................... 257/59; 257/72; 257/E31.121
(58) Field of Classification Search .................. 257/59, 257/72, E31.121
See application file for complete search history.

(56) References Cited

U.S. PATENT DOCUMENTS

| | | | | |
|---|---|---|---|---|
| 3,996,461 A | * | 12/1976 | Sulzbach et al. | ........ 250/214 R |
| 4,158,133 A | | 6/1979 | Spaeth et al. | |
| 4,931,315 A | * | 6/1990 | Mellor | ........................ 427/167 |
| 6,352,876 B1 | | 3/2002 | Bordogna et al. | |
| 6,538,267 B2 | | 3/2003 | Bordogna et al. | |
| 6,830,951 B2 | | 12/2004 | Laurin et al. | |
| 6,960,799 B2 | * | 11/2005 | Descure | ....................... 257/292 |
| 2007/0058055 A1 | * | 3/2007 | Yamaguchi et al. | ......... 348/272 |

FOREIGN PATENT DOCUMENTS

| | | |
|---|---|---|
| EP | 0 152 353 | 8/1985 |
| EP | 0 223 136 A2 | 5/1987 |
| EP | 0 915 352 A2 | 5/1999 |
| EP | 1 073 125 A2 | 1/2001 |
| JP | 57-100404 | 6/1982 |
| JP | 59-116907 | 8/1984 |

(Continued)

OTHER PUBLICATIONS

Supplementary Partial European Search Report issued in corresponding European Patent Application No. 04773319.1-1235, dated Feb. 27, 2007.

*Primary Examiner*—Thao X Le
*Assistant Examiner*—Elias Ullah
(74) *Attorney, Agent, or Firm*—McDermott Will & Emery LLP

(57) ABSTRACT

A solid-state imaging device includes a color filter that selectively transmits incoming light. The color filter includes two λ/4 multilayer films, and an insulation layer sandwiched between the two λ/4 multilayer films. Here, each of the λ/4 multilayer films is constituted by a plurality of dielectric layers, and the optical thickness of the insulation layer is not λ/4. Since this color filter has a smaller thickness, the solid-state imaging device has a smaller size.

6 Claims, 30 Drawing Sheets

FOREIGN PATENT DOCUMENTS

| | | |
|---|---|---|
| JP | 60-134201 | 7/1985 |
| JP | 63-032362 | 6/1988 |
| JP | 63-048234 | 9/1988 |
| JP | 01-133001 | 5/1989 |
| JP | 03-038063 | 2/1991 |
| JP | 07-056013 | 3/1995 |
| JP | 08-094831 | 4/1996 |
| JP | 09-275198 | 10/1997 |
| JP | 2000-196053 | 4/2000 |
| JP | 2000-252451 | 9/2000 |
| JP | 2003-230158 | 8/2003 |
| WO | WO 95/17690 | 6/1995 |

\* cited by examiner

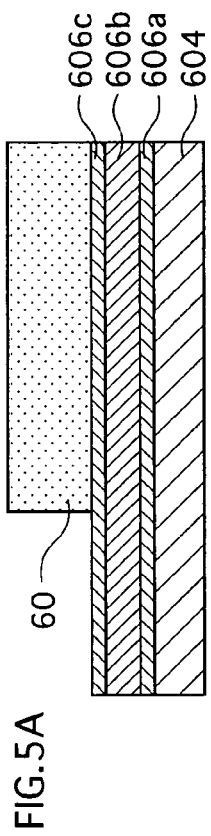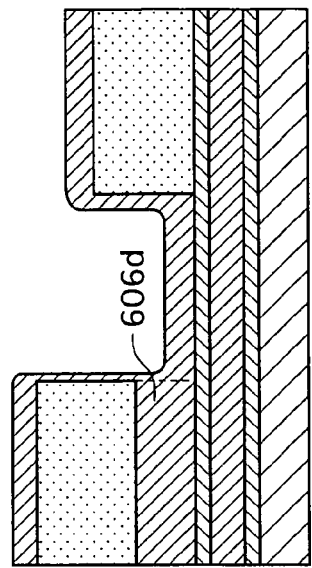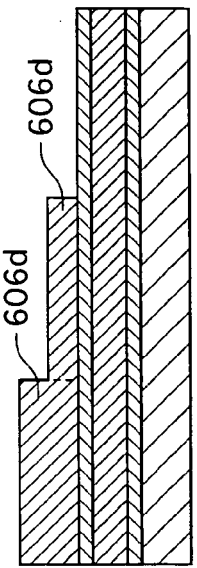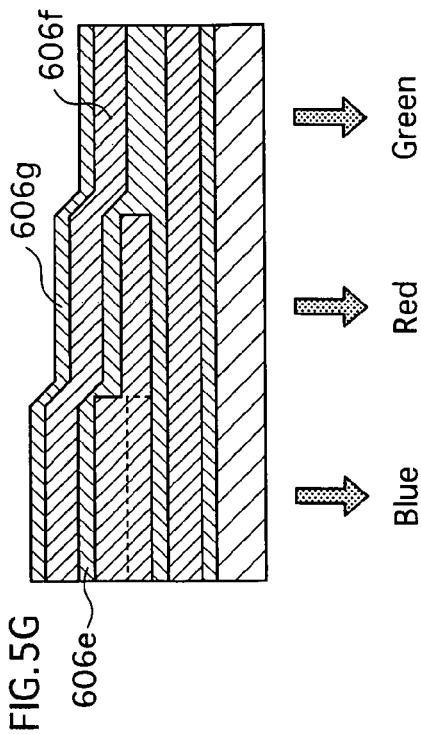
FIG.5A  FIG.5B  FIG.5C  FIG.5D  FIG.5E  FIG.5F  FIG.5G

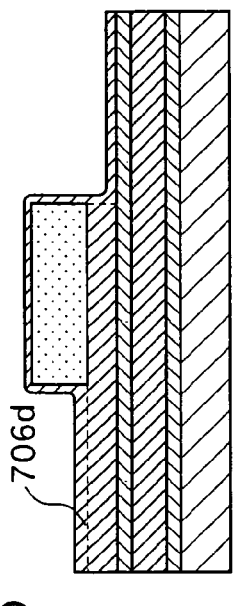
FIG.6A
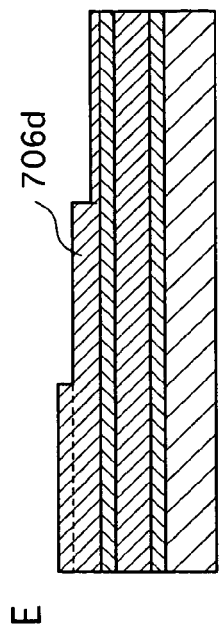
FIG.6B
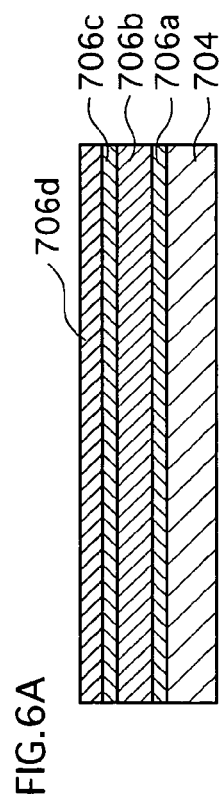
FIG.6C
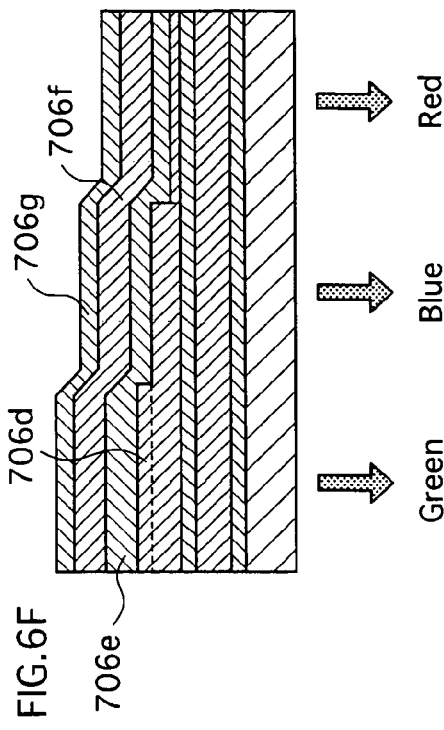
FIG.6D
FIG.6E
FIG.6F

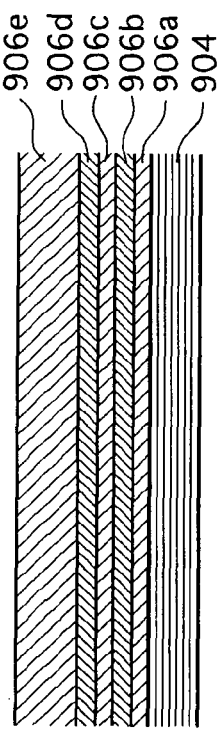
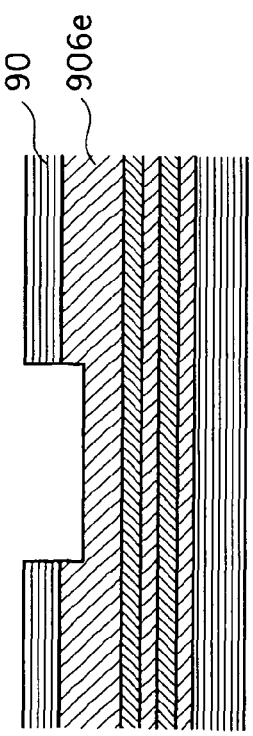
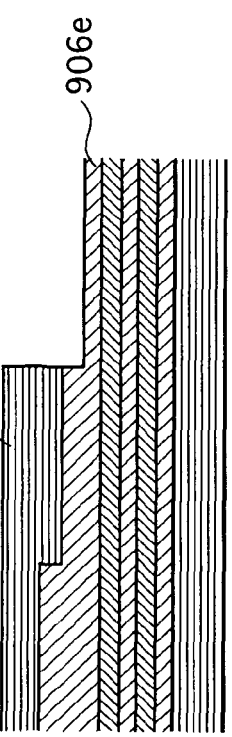
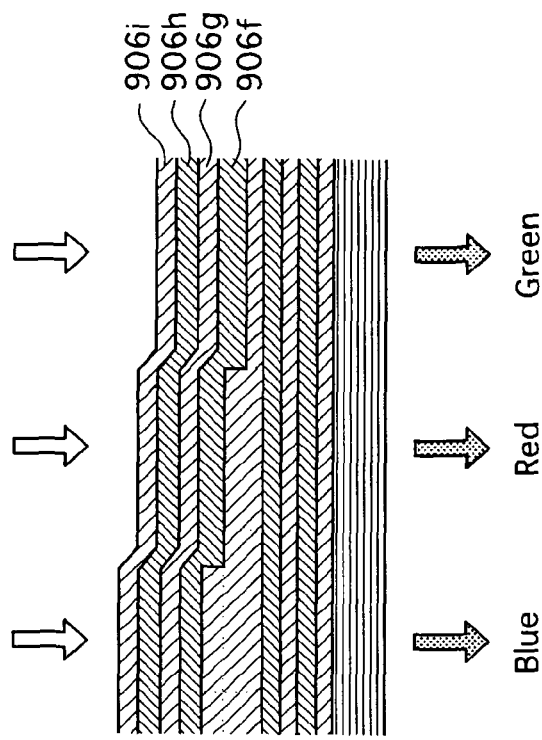

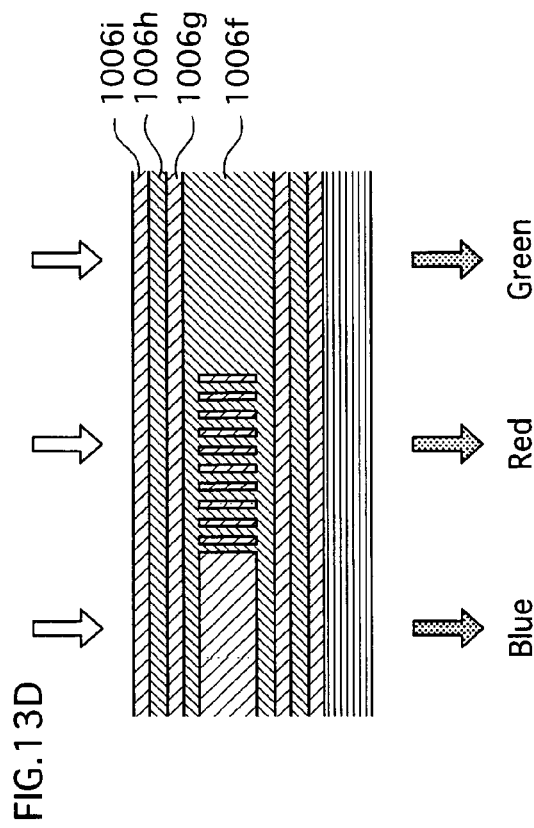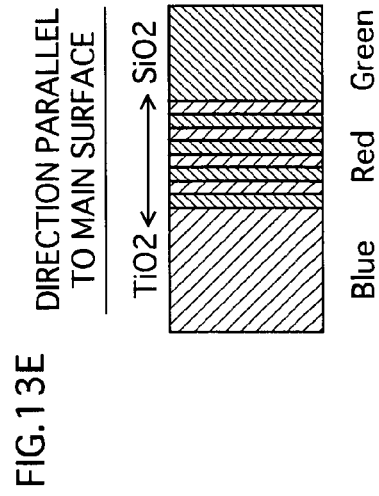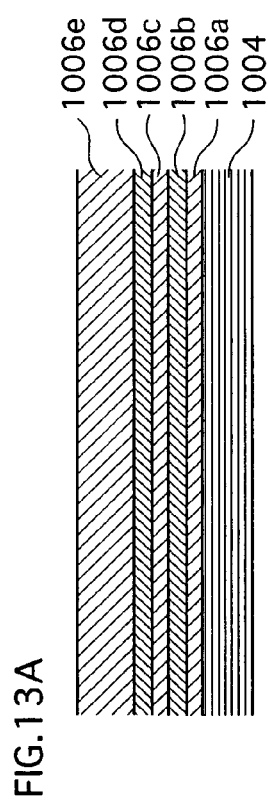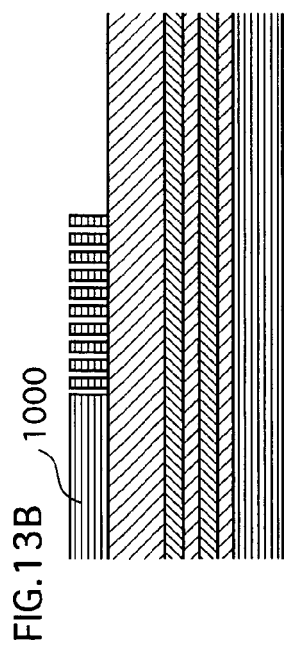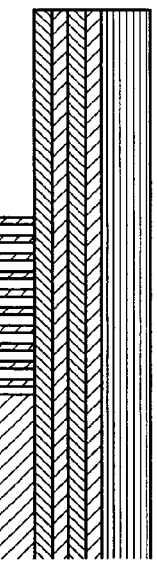

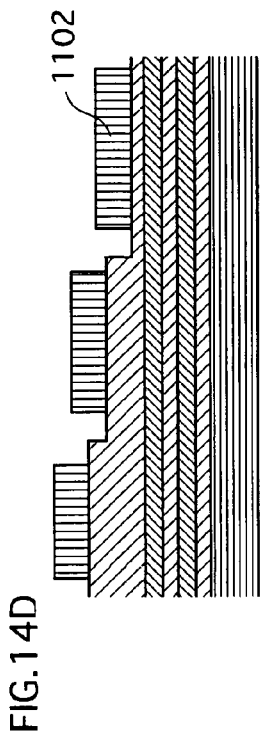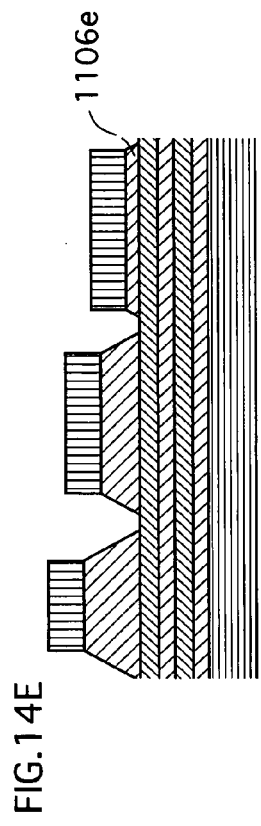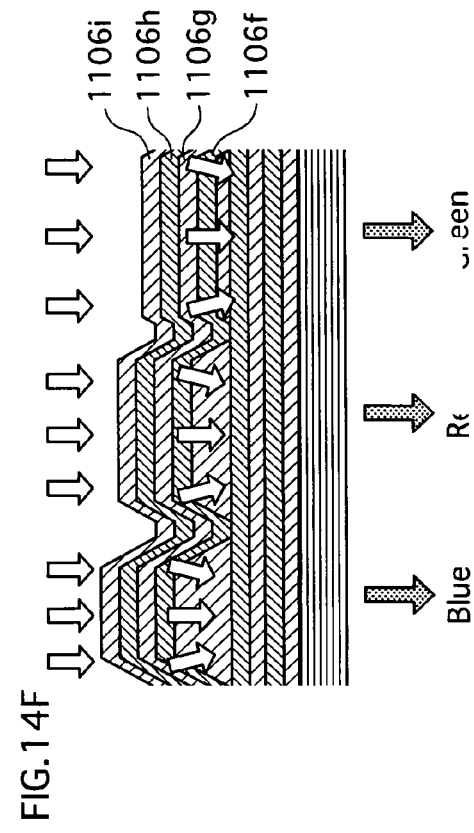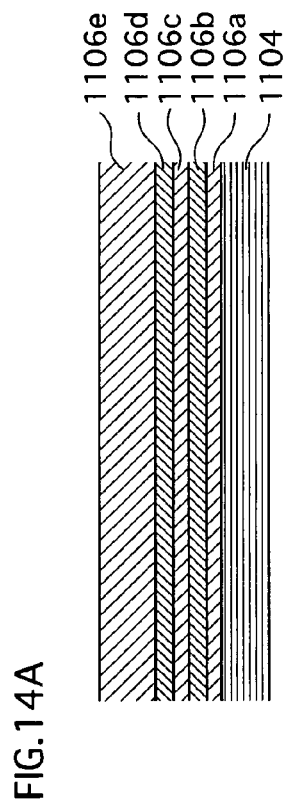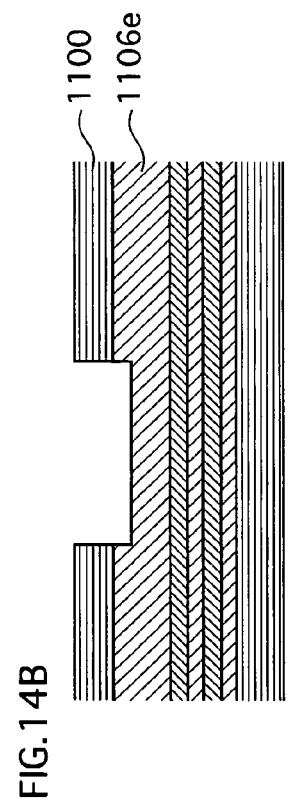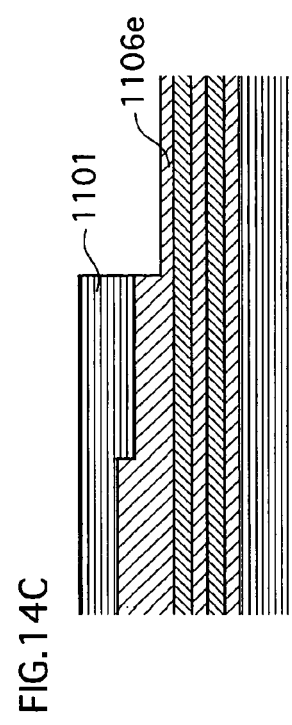

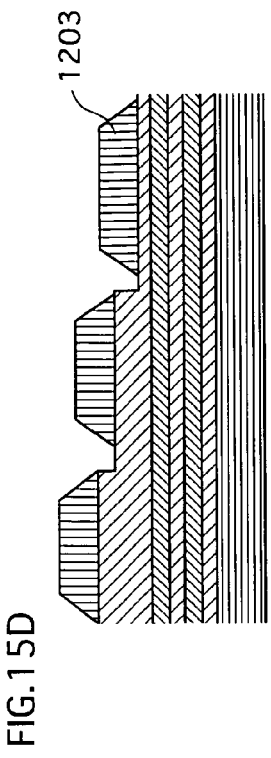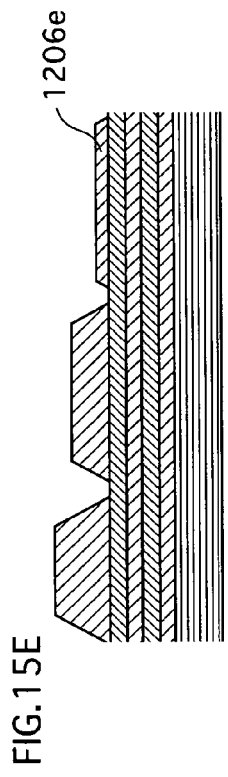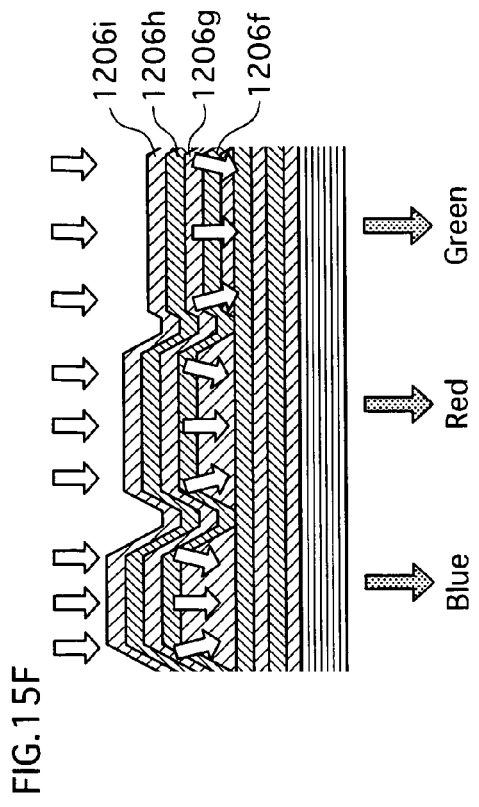
FIG.15D  FIG.15E  FIG.15F
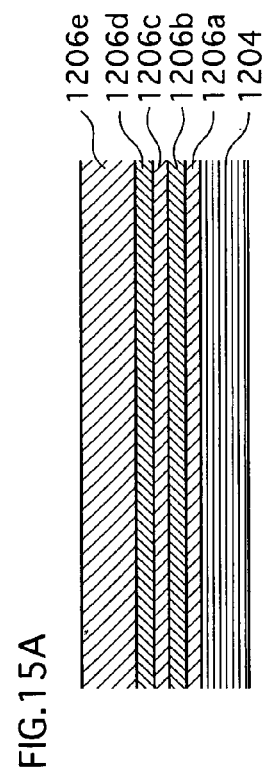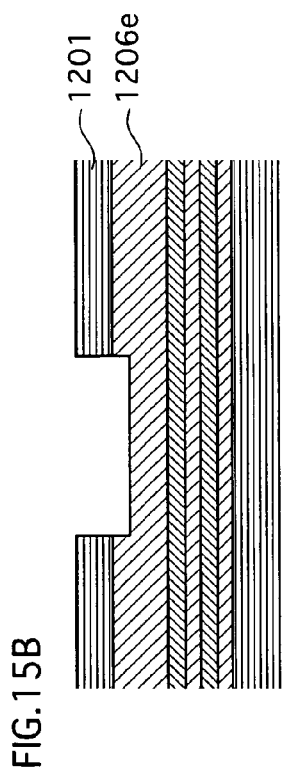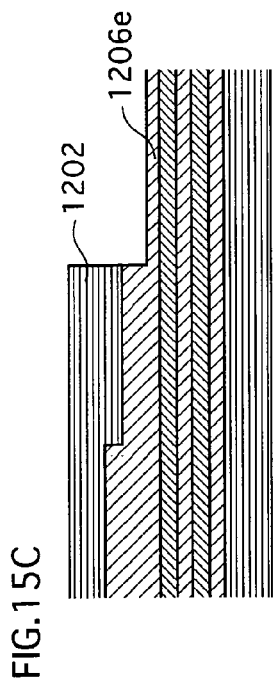
FIG.15A  FIG.15B  FIG.15C

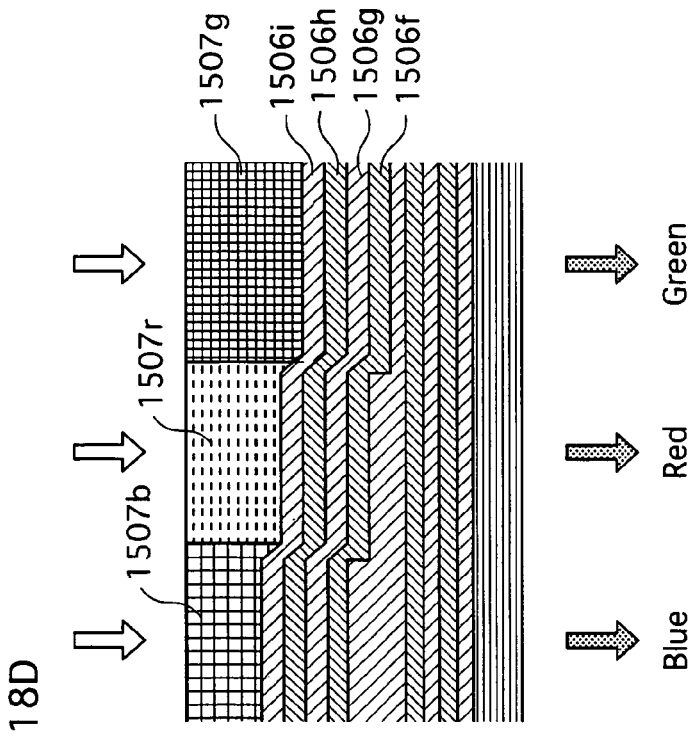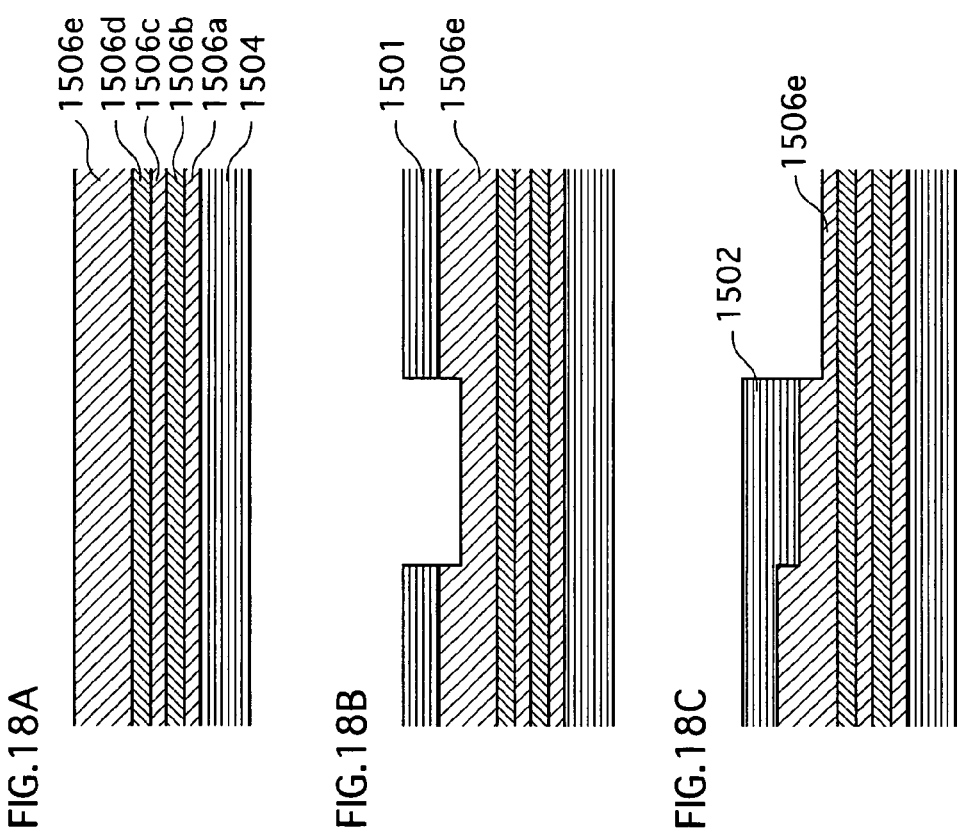

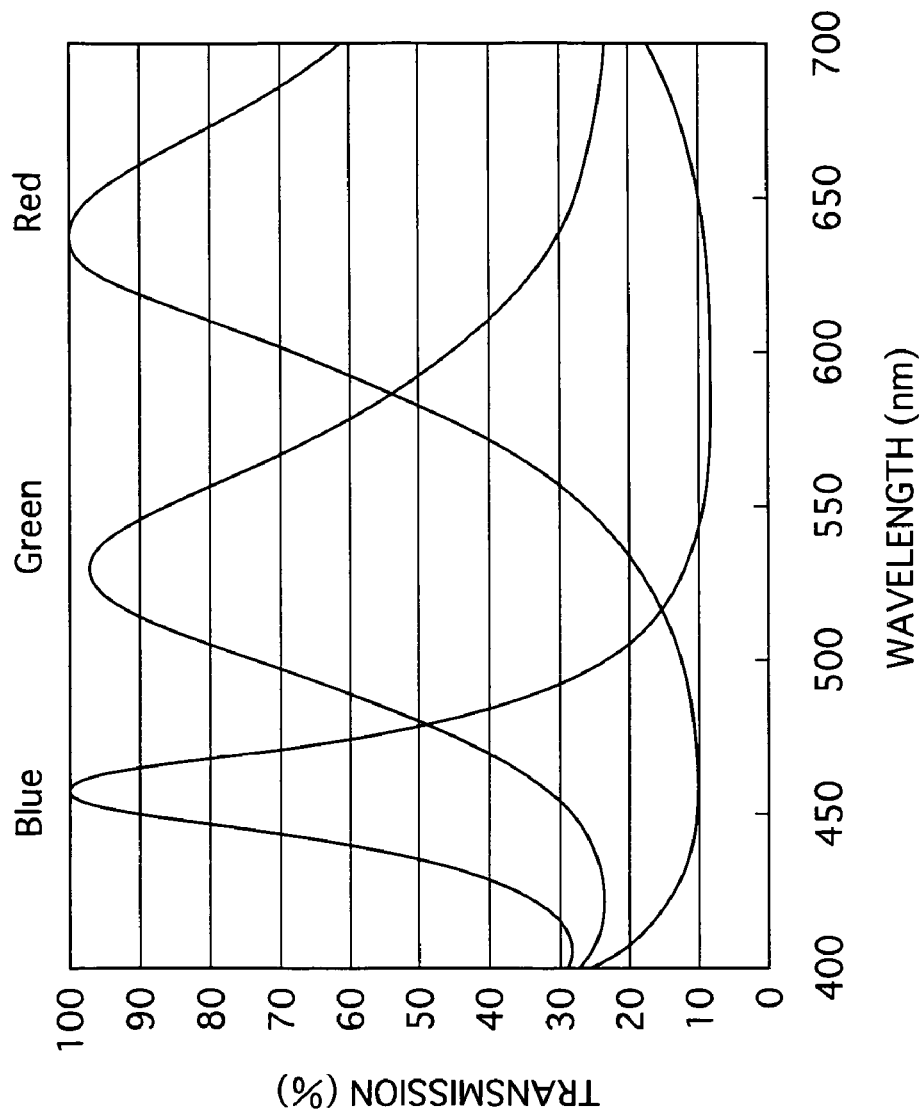

FIG.28

| B | G |
|---|---|
| R | B |

SOLID-STATE IMAGING DEVICE, MANUFACTURING METHOD OF SOLID-STATE IMAGING DEVICE, AND CAMERA EMPLOYING SAME

TECHNICAL FIELD

The present invention relates to a solid-state imaging device, a manufacturing method of a solid-state imaging device, and a camera using the same. The present invention particularly relates to a technique for achieving a color solid-state imaging device having improved performance and a smaller size.

BACKGROUND ART

In a solid-state imaging device, light-receiving elements corresponding to red (R), green (G), and blue (B) are arranged, for example, in Bayer array. FIG. 1 is a schematic cross-sectional view illustrating a construction of a conventional solid-state imaging device. As shown in FIG. 1, a solid-state imaging device 1 includes an N-type semiconductor layer 101, a P-type semiconductor layer 102, light-receiving elements 103R, 103G, and 103B, an insulation layer 104, light-blocking films 105, color filters 106R, 106G, and 106B, and a collective lens 107.

The P-type semiconductor layer 102 is formed on the N-type semiconductor layer 101. The light-receiving elements 103R, 103G, and 103B are buried in the P-type semiconductor layer 102, so as to be in contact with the insulation layer 104. Here, the light-receiving elements 103R, 103G, and 103B are separated from one another, with separation parts of the P-type semiconductor layer 102 therebetween. The light-blocking films 105 are buried in the insulation layer 104, so as to be positioned above the separation parts of the P-type semiconductor layer 102.

The color filters 106R, 106G, and 106B are color filters containing fine pigment particles, and have a thickness of approximately 1.5 μm to 2.0 μm. The pigment particles have a diameter of approximately 0.1 μm.

The color filter 106R is provided on the insulation layer 104 so as to oppose the light-receiving element 103R. Similarly, the color filters 106G and 106B are provided on the insulation layer 104 so as to oppose the light-receiving elements 103G and 103B respectively. The collective lens 107 is provided on the color filters 106R, 106G, and 106B.

When light passes through the collective lens 107, the color filter 106G transmits only green light, and the green light is collected on the light-receiving element 103G. The light-blocking films 105 prevent the green light, which has been transmitted through the color filter 106G, from entering the light-receiving elements 103R and 103B. Here, the light-receiving elements 103R, 103G, and 103B convert luminance of received light into an electric charge by photoelectric conversion, and stores therein the electric charge.

Such a solid-state imaging device appears in, for example, Japanese patent application publication No. H05-6986, and "Kotaisatsuzousoshi no kiso" (The basics of solid-state imaging devices), Nihon Rikou Shuppannkai (Japan Science and Technology Publishing), written by Andoh and Komobuchi, edited by the Institute of Image, Information and television engineers, issued in December 1999, p. 183-188.

DISCLOSURE OF THE INVENTION

Here, light enters a solid-state imaging device from many directions. This being so, light obliquely entering a solid-state imaging device (hereinafter referred to as oblique light) may be received by a light-receiving element different from an intended light-receiving element. This causes a decrease in color separation function, resolution, and wavelength sensitivity, and an increase in noise.

Furthermore, pixels need to be made smaller in order to enhance resolution of a solid-state imaging device. However, if pigment particles mentioned earlier are reduced in size beyond limits, degradation in sensitivity and unevenness in color will inevitably occur.

These problems are solved by a solid-state imaging device including a filter unit that selectively transmits incoming light. The filter unit comprises two λ/4 multilayer films, and an insulation layer sandwiched between the λ/4 multilayer films. Each of the λ/4 multilayer films includes a plurality of dielectric layers, and an optical thickness of the insulation layer is different from λ/4.

Being formed using a dielectric multilayer film as described above, the filter unit can have a smaller thickness. This prevents oblique light from reaching a pixel adjacent to an intended pixel, thereby improving the color separation function.

Here, each of the two λ/4 multilayer films includes a first dielectric layer made of a material having a different refractive index from a material forming the insulation layer, and a second dielectric layer made of a material having a substantially same refractive index as the material forming the insulation layer. Here, the first dielectric layer is formed so as to be in contact with a main surface of the insulation layer, and the second dielectric layer is formed so as to be in contact with a main surface of the first dielectric layer which faces away from the insulation layer.

Here, the optical thickness of the insulation layer is determined according to a wavelength which the filter unit transmits.

According to this construction, color separation can be realized even when the filter unit has a thickness substantially equivalent to the wavelength of incoming light (~500 nm). As a result, the filter unit can have a smaller thickness, which produces significant effects in reducing the degradation of the color separation function caused by oblique light.

Here, the insulation layer has therein a through hole or groove extending substantially vertical to the main surface of the insulation layer. The through hole or groove is filled with a material same as the material forming the first dielectric layer. The filter unit transmits a wavelength determined according to a ratio between an area of the through hole or groove, and an area of the insulation layer excluding the through hole or groove, when the insulation layer is seen two-dimensionally in plane.

According to this construction, in the insulation layer, materials different in refractive index are alternately arranged in a direction parallel to the main surfaces of the insulation layer. This causes an effective refractive index detected by incoming light to be different from the refractive indices of the materials, thereby realizing wavelength selection. In this way, color separation can be realized even when the filter unit has a thickness substantially equivalent to the wavelength of incoming light (~500 nm). As a result, the filter unit can have a smaller thickness, which produces significant effects in reducing the degradation of the color separation function caused by oblique light. Furthermore, since it is not required to change the thickness of the insulation layer in multiple levels, the manufacturing process can be simplified, and stable color separation characteristics can be realized.

Here, the solid-state imaging device further includes a plurality of light-receiving units provided in a semiconductor substrate two-dimensionally. Here, a portion of the insulation layer corresponding to each of the plurality of light-receiving units has an inwardly inclined lateral surface.

According to this construction, the filter unit can collect incoming light. This can further prevent degradation of color separation.

Here, the solid-state imaging device further includes a plurality of light-receiving units provided in a semiconductor substrate two-dimensionally. Here, the optical thickness of the insulation layer continuously changes, so that each of the plurality of light-receiving units receives a particular wavelength of light.

According to this construction, the passband characteristics of the filter unit can be improved.

Here, the solid-state imaging device further includes a plurality of light-receiving units provided in a semiconductor substrate two-dimensionally. Here, a thickness of a portion of the insulation layer through which light is transmitted to reach each of the plurality of light-receiving units changes in two or more levels.

According to this construction, the thickness of the portion of the insulation layer corresponding to each pixel changes in two or more levels. Therefore, a wider wavelength range of incoming light enters the light-receiving unit corresponding to the pixel. As a consequence, wavelength sensitivity for each color can be improved.

Here, an absorbing member is provided on a main surface of one of the $\lambda/4$ multilayer films which faces away from the insulation layer, the main surface partly reflecting the incoming light. Here, the absorbing member is a color filter containing pigments or dyes. This construction can reduce occurrence of noise due to light reflected by the dielectric multilayer film.

The above problems are also solved by a camera including a solid-state imaging device that has a filter unit that selectively transmits incoming light. The filter unit comprises two $\lambda/4$ multilayer films, and an insulation layer sandwiched between the $\lambda/4$ multilayer films. Each of the $\lambda/4$ multilayer films includes a plurality of dielectric layers, and an optical thickness of the insulation layer is different from $\lambda/4$. This camera achieves excellent performance based on reduced degradation of color separation.

The above problems are also solved by a manufacturing method of a solid-state imaging device including a filter unit that selectively transmits incoming light. The filter unit is formed by conducting steps comprising a first formation step of forming a first $\lambda/4$ multilayer film on a semiconductor substrate, the first $\lambda/4$ multilayer film being constituted by a plurality of dielectric layers, a second formation step of forming a first insulation layer on the first $\lambda/4$ multilayer film, a first removal step of removing the first insulation layer except for a first region, a third formation step of forming a second insulation layer on the first $\lambda/4$ multilayer film and the first region of the first insulation layer, a second removal step of removing a second region of the second insulation layer, the second region being positioned on the first $\lambda/4$ multilayer film, and a fourth formation step of forming a second $\lambda/4$ multilayer film on the second insulation layer and the first $\lambda/4$ multilayer film, the second $\lambda/4$ multilayer film being constituted by a plurality of dielectric layers.

When manufacturing a solid-state imaging device having a filter formed by using a dielectric multilayer film, it is essential to control the thickness of each layer of the filter at the level of nanometers, in order to attain ideal wavelength selection. By utilizing the above-described film formation process performed under optimal conditions, each of the layers forming the dielectric multilayer film can achieve a thickness having unevenness within plus/minus 2%.

The above problems are also solved by a manufacturing method of a solid-state imaging device including a filter unit that selectively transmits incoming light. The filter unit is formed by conducting steps comprising a first formation step of forming a first $\lambda/4$ multilayer film on a semiconductor substrate, the first $\lambda/4$ multilayer film being constituted by a plurality of dielectric layers, a second formation step of forming a first insulation layer on a first region of the first $\lambda/4$ multilayer film by using a liftoff method, a third formation step of forming a second insulation layer on a second region of the first $\lambda/4$ multilayer film by using the liftoff method, the second region being different from the first region, and a fourth formation step of forming a second $\lambda/4$ multilayer film on the first insulation layer, the second insulation layer, and the first $\lambda/4$ multilayer film, the second $\lambda/4$ multilayer film being constituted by a plurality of dielectric layers.

By using the liftoff method to form an insulation layer in the filter unit, the same effects of controlling the thickness of the insulation layer more favorably, and reducing the unevenness of the thickness can be produced.

The above problems are also solved by a manufacturing method of a solid-state imaging device including a filter unit that selectively transmits incoming light. The filter unit is formed by conducting steps comprising a first formation step of forming a first $\lambda/4$ multilayer film on a semiconductor substrate, the first $\lambda/4$ multilayer film being constituted by a plurality of dielectric layers, a second formation step of forming a first insulation layer on the first $\lambda/4$ multilayer film, a first removal step of removing the first insulation layer except for a first region, a third formation step of forming a second insulation layer on a second region in the first region of the first insulation layer, and on a region of the first $\lambda/4$ multilayer film where the first insulation layer is not formed, by using a liftoff method, and a fourth formation step of forming a second $\lambda/4$ multilayer film on the first insulation layer and the second insulation layer, the second $\lambda/4$ multilayer film being constituted by a plurality of dielectric layers.

To form an insulation layer whose thickness changes in three levels, three layer formation steps are generally required. According to the above manufacturing method, however, an insulation layer whose thickness changes in three levels can be obtained by conducting only two layer formation steps, based on the combination of etching and liftoff methods. Thus, the filter formation process can be simplified. This shortens the turnaround time, and reduces the manufacturing cost.

The above problems are also solved by a manufacturing method of a solid-state imaging device including a filter unit that selectively transmits incoming light. The filter unit is formed by conducting steps comprising a first formation step of forming a first $\lambda/4$ multilayer film on a semiconductor substrate, the first $\lambda/4$ multilayer film being constituted by a plurality of dielectric layers, a second formation step of forming a first insulation layer on the first $\lambda/4$ multilayer film, a first removal step of removing the first insulation layer except for a first region, a third formation step of forming a second insulation layer on the first $\lambda/4$ multilayer film and the first region of the first insulation layer, the second insulation layer being made of a different material from the first insulation layer, a second removal step of removing the second insulation layer, except for a portion which is formed on a second region of the first insulation layer, and a fourth formation step of forming a second $\lambda/4$ multilayer film on the first insulation layer, the second insulation layer, and the first λ/4 multilayer film, the second λ/4 multilayer film being constituted by a plurality of dielectric layers.

To form an insulation layer whose thickness changes in three levels, three layer formation steps are generally required. According to the above manufacturing method, however, an insulation layer whose thickness changes in three levels can be obtained by conducting only two layer formation steps, based on selective etching on two insulation layers made of different materials. Thus, the filter formation process can be simplified. This shortens the turnaround time, and reduces the manufacturing cost.

The above problems are also solved by a manufacturing method of a solid-state imaging device including a plurality of light-receiving units provided in a semiconductor substrate two-dimensionally, and a filter unit that selectively transmits incoming light. The filter unit includes two λ/4 multilayer films, and an insulation layer sandwiched between the λ/4 multilayer films. Each of the λ/4 multilayer films is constituted by a plurality of dielectric layers. The manufacturing method comprises a formation step of forming a resist in a middle of a portion of the insulation layer corresponding to each of the plurality of light-receiving units, and a processing step of processing the portion of the insulation layer by etching, so as to have an inclined lateral surface.

Here, in the formation step, the resist is formed so as to have an inclined lateral surface. Here, in the formation step, the resist is formed so as to have an inclined lateral surface, by varying an amount of exposure to light.

The solid-state imaging device further includes a plurality of light-receiving units provided in a semiconductor substrate two-dimensionally. Here, a wavelength of light received by each of the plurality of light-receiving units is determined based on whether the insulation layer has a portion in correspondence with the light-receiving unit, and, if the insulation layer has the portion, a thickness and/or a material of the portion of the insulation layer. According to this construction, color separation can be realized by the construction of the insulation layer included in the dielectric multilayer film.

The solid-state imaging device further includes a plurality of light-receiving units provided in a semiconductor substrate two-dimensionally. Here, a portion of the filter unit corresponding to each of the plurality of light-receiving units transmits a particular wavelength of light, and the two λ/4 multilayer films are symmetrically structured with respect to the insulation layer.

The above problems are also solved by a solid-state imaging device including a filter unit that selectively transmits incoming light, and a light-receiving unit that receives the light transmitted by the filter unit. The filter unit comprises a λ/4 multilayer film constituted by a plurality of dielectric layers. Among the plurality of dielectric layers constituting the λ/4 multilayer film, a dielectric layer that is positioned most distant from the light-receiving unit is made of a low refractive index material. This construction can prevent light that enters the filter unit from being reflected, thereby realizing high-quality imaging.

The above problems are also solved by a solid-state imaging device including a filter unit that selectively transmits incoming light. The filter unit comprises a λ/4 multilayer film constituted by a plurality of dielectric layers, and a protective layer is provided on one of main surfaces of the λ/4 multilayer film, or within the λ/4 multilayer film. Here, the protective layer is made of silicon nitride. This construction can enhance the reliability and moisture resistance of the solid-state imaging device.

The solid-state imaging device further includes a plurality of light-receiving units provided in a semiconductor substrate two-dimensionally, and a light-collecting unit collecting the incoming light. Here, a portion of the filter unit corresponding to each of the plurality of light-receiving units transmits a particular wavelength, and a main surface of the filter unit which faces away from the plurality of light-receiving units is flat.

According to this construction, the same distance can be achieved between each light-collecting unit and a corresponding light-receiving unit. Therefore, light-collecting units having the same focal length can be used for the solid-state imaging device, regardless of different wavelengths of light to be received by the light-receiving units. As a result, the number of types of parts to constitute the solid-state imaging device can be reduced, which can facilitate the manufacturing of the solid-state imaging device, and reduce the manufacturing cost.

The above problems are also solved by a solid-state imaging device comprising a plurality of light-receiving units provided in a semiconductor substrate two-dimensionally, and a filter unit that selectively transmits incoming light. Here, the filter unit has a λ/4 multilayer film constituted by a plurality of dielectric layers, and a distance between (i) the plurality of light-receiving units and (ii) a high refractive index layer which is positioned closest to the plurality of light-receiving units, among two or more high refractive index layers in the λ/4 multilayer film, falls within a range of 1 nm and λ. According to this construction, the color filter and light-receiving elements are in contact with each other. This can further reliably prevent degradation of color separation caused by oblique light.

The above problems are also solved by a solid-state imaging device including a plurality of unit pixels arranged two-dimensionally. Each of the plurality of unit pixels comprises a light-receiving unit detecting an intensity of light, and a filter unit having a λ/4 multilayer film constituted by a plurality of dielectric layers. The filter unit transmits one of red light, green light, and blue light. Here, the plurality of unit pixels are arranged in Bayer array, in such a manner that every four adjacent unit pixels making a square has two unit pixels that include filter units transmitting blue light.

Considering its transmission characteristics, a dielectric multilayer film has a smaller full width at half maximum for blue light than for red and green light. By employing the above arrangement, however, the wavelength range to detect blue light can be extended, which results in higher sensitivity of the solid-state imaging device.

The above-described manufacturing methods of a solid-state imaging device are characterized by a technique to change the thickness of the insulation layer partially. Such a technique is conducted, to realize color separation, during the manufacturing process of the dielectric multilayer film that is to be formed above photoelectric converting units, in order to separate incoming light based on wavelengths. This technique does not involve dry or wet etching, which changes the thickness of a layer that has been formed. Instead, this technique realizes an insulation layer whose thickness is partially changed, as a result of forming layers. Therefore, the above manufacturing methods can control the thickness of the insulation layer more favorably, and reduce the unevenness of the thickness of the insulation layer.

The above-described solid-state imaging devices have, above the photoelectric converting units, the dielectric multilayer film to separate incoming light based on wavelengths. Here, color separation can be realized simply by one dielectric layer, included in the dielectric multilayer film, whose thickness is partially changed. This means that color separation can be realized with the dielectric multilayer film having a thickness substantially equivalent to the wavelength of incoming light (~500 nm). As a result, the color filter can have a smaller thickness, which produces significant effects in reducing the degradation of the color separation function caused by oblique light.

BRIEF DESCRIPTION OF THE DRAWINGS

FIGS. 5A-5G are cross-sectional views illustrating a manufacturing method of a color filter relating to a third embodiment of the present invention.

FIGS. 6A-6F are cross-sectional views illustrating a manufacturing method of a color filter relating to a fourth embodiment of the present invention.

FIGS. 10A-10D are cross-sectional view views illustrating a manufacturing method of a color filter relating to a sixth embodiment of the present invention.

FIGS. 13A-13E are cross-sectional views illustrating a manufacturing method of a color filter relating to a seventh embodiment of the present invention.

FIGS. 14A-14F are cross-sectional views illustrating a first manufacturing method of a color filter relating to an eighth embodiment of the present invention.

FIGS. 15A-15F are cross-sectional views illustrating a second manufacturing method of the color filter relating to the eighth embodiment of the present invention.

FIGS. 18A-18D are cross-sectional views FIG. 18 illustrating a manufacturing method of a color filter relating to an eleventh embodiment of the present invention.

FIG. 20 is a graph illustrating transmission characteristics of the color filter relating to the modification example (1) of the present invention.

FIG. 28 illustrates an arrangement of color filters, relating to a modification example (6) of the present invention.

BEST MODE FOR CARRYING OUT THE INVENTION

The following describes a solid-state imaging device, a manufacturing method of a solid-state imaging device, and a camera, relating to embodiments of the present invention, with reference to the attached figures.

[1] First Embodiment

Figure 1:
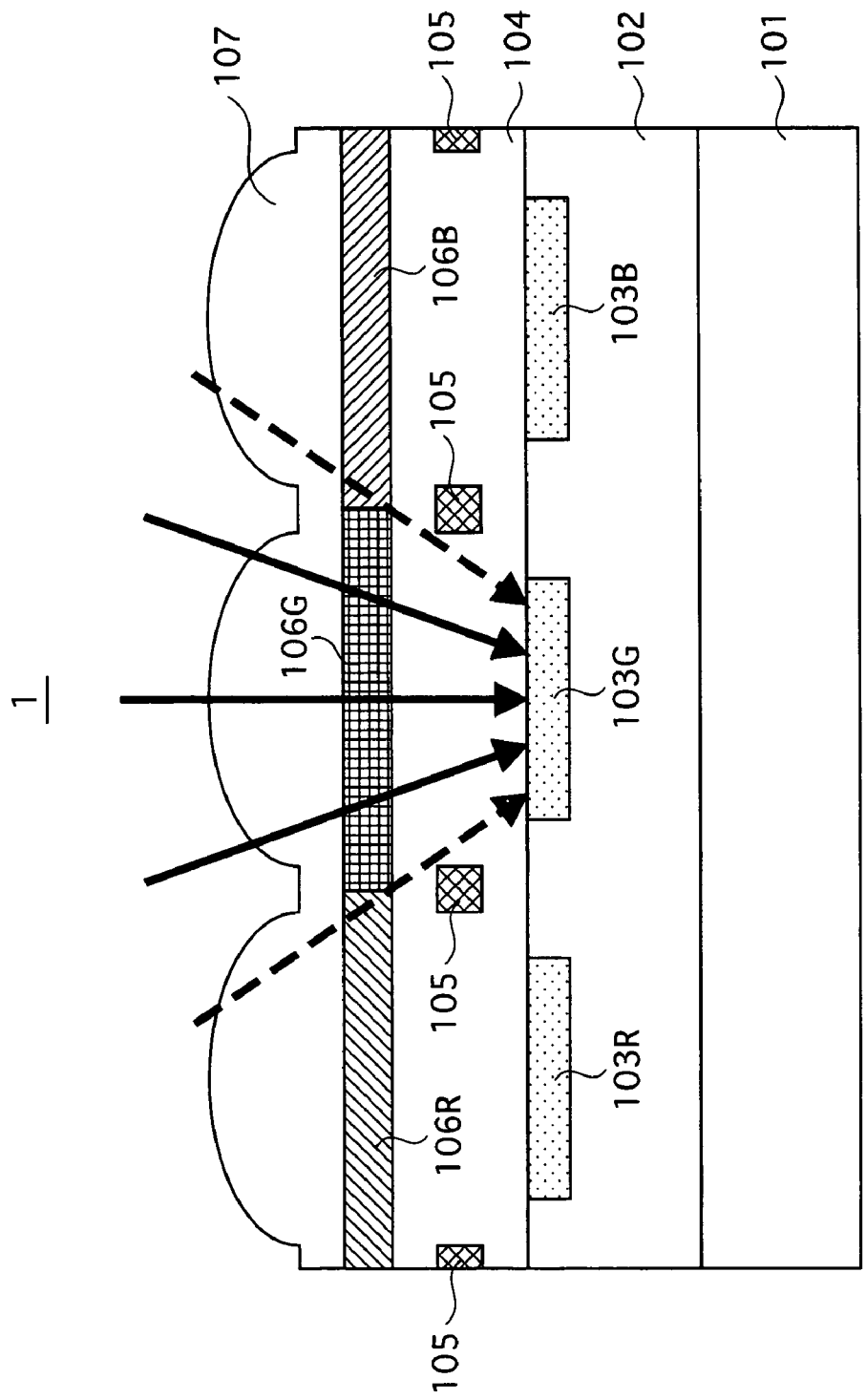
FIG. 1 is a cross-sectional view illustrating a construction of a conventional solid-state imaging device.

A solid-state imaging device relating to a first embodiment has substantially the same cross-sectional construction as a conventional solid-state imaging device (see FIG. 1), except for the construction of the color filter.

Figure 2:
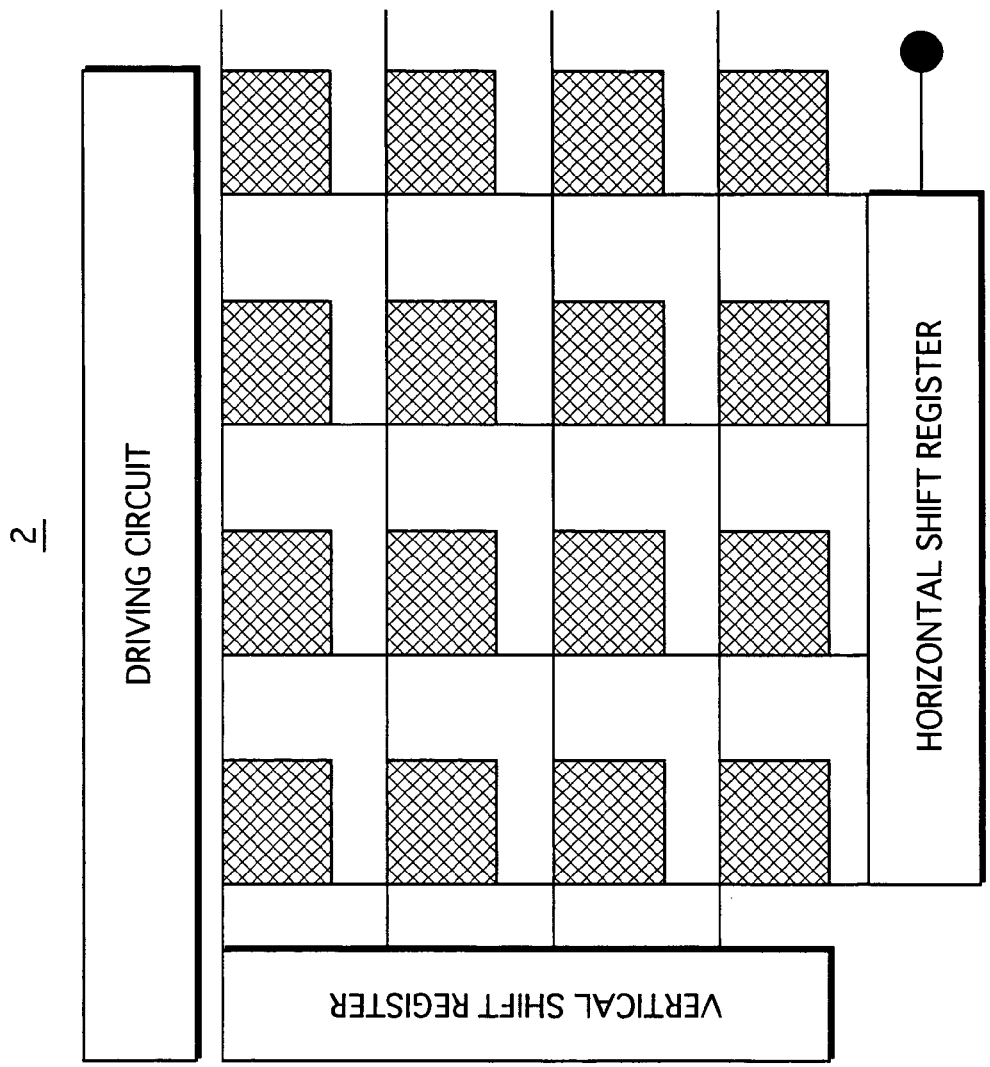
FIG. 2 is a plan view illustrating a construction of a solid-state imaging device relating to a first embodiment of the present invention.

FIG. 2 is a plan view illustrating the construction of the solid-state imaging device relating to the first embodiment. As shown in FIG. 2, unit pixels (shaded parts), which are light-receiving units, are arranged two-dimensionally in a solid-state imaging device 2 relating to the first embodiment. A vertical shift register selects a row, and a horizontal shift register selects a signal in a pixel in the selected row. In this way, a color signal corresponding to each pixel is output through an output amplifier (not shown in FIG. 2). A driving circuit causes the vertical shift register, horizontal shift register, and output amplifier to operate.

According to the first embodiment, a color filter is formed by a dielectric multilayer film, in which a low refractive index material and a high refractive index material are alternately layered. An example of the low refractive index material is silicon oxide ($SiO_2$), and an example of the high refractive index material is silicon nitride ($Si_3N_4$). It goes without saying that the layers constituting the dielectric multilayer film are stacked in the same direction as the layers constituting the solid-state imaging device 2. Except for one layer, the layers constituting the dielectric multilayer film each have substantially the same optical thickness. Here, an optical thickness of a layer is expressed as nd, which is a product obtained by multiplying n denoting a refractive index of the material forming the layer, with d denoting the thickness of the layer.

With this construction, the color filter can have a smaller thickness, which results in a smaller distance between the light-receiving elements and light-blocking films. Consequently, the first embodiment can reliably prevent degradation of color separation caused by oblique light.

The first embodiment can produce the same effects of preventing degradation of color separation, even when a light collection angle is increased to improve light collection efficiency of the micro lens. As a consequence, the solid-state imaging device 2 relating to the first embodiment achieves improved sensitivity.

[2] Second Embodiment

The following describes a solid-state imaging device relating to a second embodiment of the present invention. The solid-state imaging device relating to the second embodiment has substantially the same construction as the solid-state imaging device relating to the first embodiment, except for the construction of the dielectric multilayer film.

Figure 3:
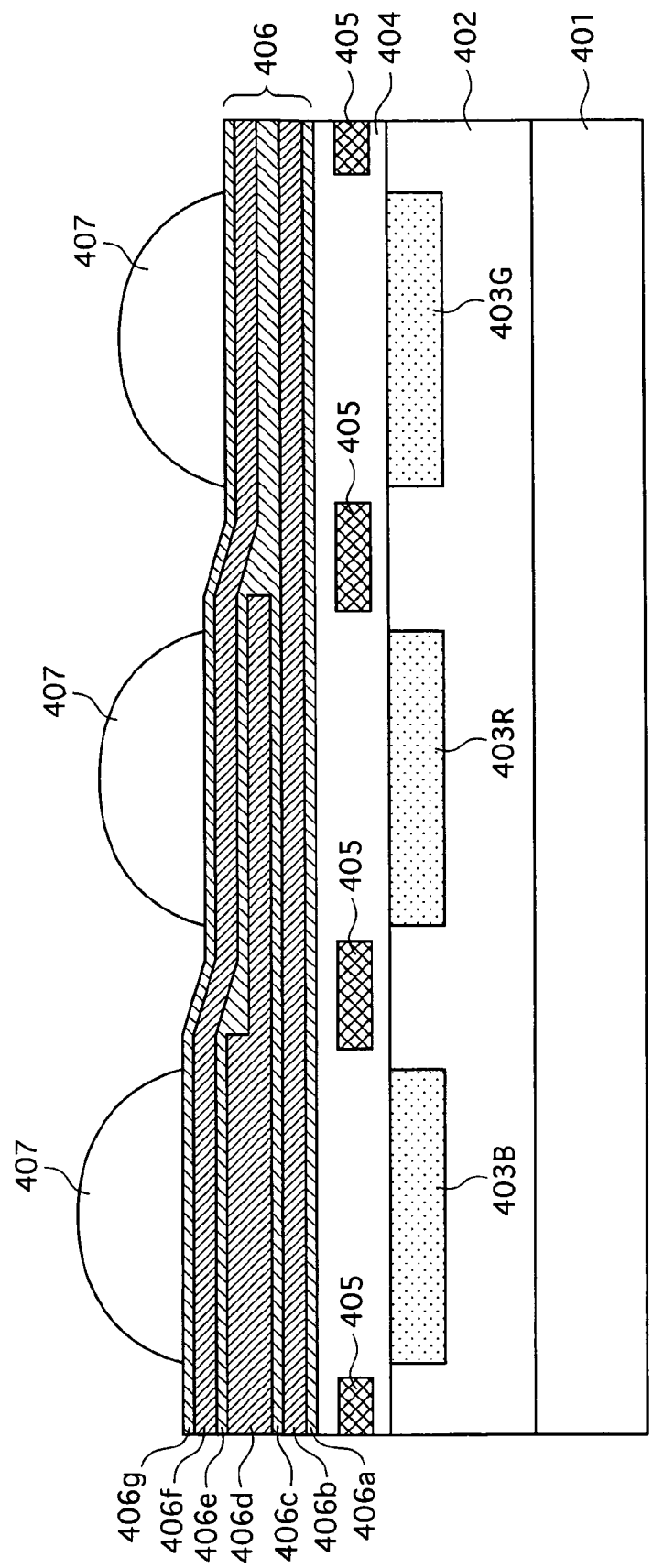
FIG. 3 is a cross-sectional view illustrating a construction of a solid-state imaging device relating to a second embodiment of the present invention.

FIG. 3 is a cross-sectional view illustrating the construction of the solid-state imaging device relating to the second embodiment. As shown in FIG. 3, a solid-state imaging device 4 includes an N-type semiconductor substrate 401, a P-type semiconductor layer 402, light-receiving elements 403R, 403G, and 403B, an insulation layer 404, light-blocking films 405, a color filter 406, and micro lenses 407.

The solid-state imaging device 4 is structured in such a manner that the P-type semiconductor layer 402, light-receiving elements 403R, 403G, and 403B, insulation layer 404 that can transmit light, light-blocking films 405, color filter 406, and micro lenses 407 are layered in this order on the N-type semiconductor layer 401.

The color filter 406 relating to the second embodiment is characterized by being a dielectric multilayer film in which titan dioxide ($TiO_2$) layers 406a, 406c, 406e and 406g, and silicon dioxide ($SiO_2$) layers 406b, 406d and 406f alternate with each other.

FIG. 4 illustrates the manufacturing process of the color filter 406. Note that FIG. 4 does not show the light-blocking films 405 and light-receiving elements 403R, 403G and 403B, which are irrelevant to the manufacturing process of the color filter 406. To start with, as shown in FIG. 4A, the $TiO_2$ layer 406a, $SiO_2$ layer 406b, $TiO_2$ layer 406c, $SiO_2$ layer 406d are formed in the stated order on the insulation layer 404. These layers 406a to 406d are formed by using a radio frequency (RF) sputtering device.

The color filter 406 relating to the second embodiment has a λ/4 multilayer structure with a designed center wavelength λ of 530 nm. The $TiO_2$ layers 406a and 406c, and $SiO_2$ layer 406b each have an optical thickness of λ/4=132.5 nm, and the $SiO_2$ layer 406d has an optical thickness of 150 nm.

Figure 4D:
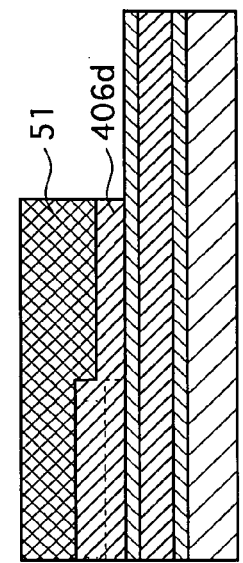
FIGS. 4A-4E are cross-sectional views illustrating a manufacturing method of a color filter relating to the second embodiment of the present invention.
Figure 4E:
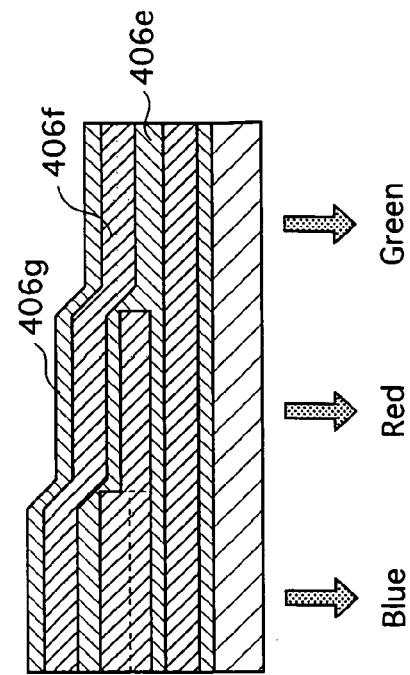
Figure 4A:
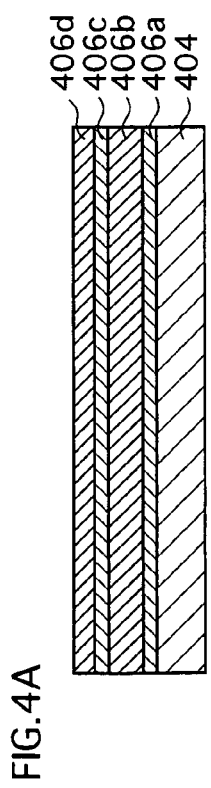
Figure 4B:
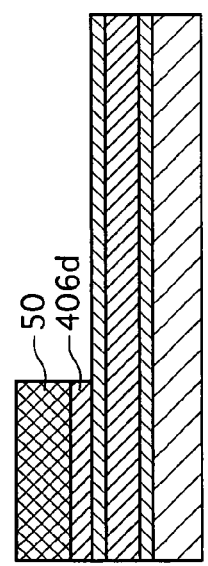

After this, a resist 50 is formed in a blue region on the $SiO_2$ layer 406d, as shown in FIG. 4B. Specifically speaking, the resist 50 is formed in such a manner that a resist is applied onto the $SiO_2$ layer 406d, subjected to thermal processing (prebake), exposed to light using an exposure device such as a stepper, developed with the use of a material such as an organic solvent, and subjected to thermal processing again (postbake) The resist 50 has a thickness of 1 μm. Here, the blue region is a region of the color filter 406, which is designed to enable the light-receiving element 403B to detect blue light.

After this, a portion of the $SiO_2$ layer 406d which is not covered by the resist 50 is removed by etching. In detail, this etching process is dry etching using a CF gas, and conducted under the conditions where the etching gas is $CF_4$, the gas flow rate is 40 sccm, the RF power of 200 W is applied, and the degree of vacuum is 0.050 Torr.

Instead of dry etching, wet etching with the use of hydrofluoric acid or the like may be utilized, because $SiO_2$ and $TiO_2$ have high etching selectivity for hydrofluoric acid. In this case, the $SiO_2$ layer 406d with the resist 50 is subjected to etching, in such a manner that the $SiO_2$ layer 406d with the resist 50 is soaked, for five seconds, in hydrofluoric acid mixed with an ammonium fluoride solution in the proportion of one to four. Thus, the $SiO_2$ layer 406d is processed into the state shown in FIG. 4B.

Figure 4C:
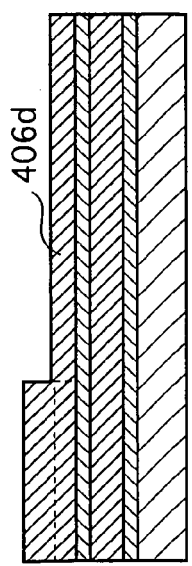

Subsequently, after the resist 50 is removed with the use of an organic solvent or the like, an $SiO_2$ layer is formed using the RF sputtering device, as shown in FIG. 4C. The new $SiO_2$ layer has an optical thickness of 45 nm. This means that the blue region of the $SiO_2$ layer 406d has an optical thickness of 195 nm, and the remaining portion of the $SiO_2$ layer 406d has an optical thickness of 45 nm.

After this, a resist 51 is formed in the blue region and a red region on the $SiO_2$ layer 406d, as shown in FIG. 4D. Then, a portion of the $SiO_2$ layer 406d which is not covered by the resist 51 is removed by etching. After the etching process, the resist 51 is removed. Here, the red region is a region of the color filter 406, which is designed to enable the light-receiving element 403R to detect red light.

Subsequently, the $TiO_2$ layer 406e, $SiO_2$ layer 406f, and $TiO_2$ layer 406g are formed in this order in the blue, red, and green regions using the RF sputtering device, as shown in FIG. 4E. Here, the $TiO_2$ layers 406e and 406g, and the $SiO_2$ layer 406f each have an optical thickness of λ/4.

In this manner, the color filter 406 relating to the second embodiment can be manufactured. By employing the above-described manufacturing method, each of the layers forming the color filter 406 achieves a thickness having unevenness within plus/minus 2%. As a result, the color filter 406 can perform color separation at higher precision.

[3] Third Embodiment

The following describes a solid-state imaging device relating to a third embodiment of the present invention. The solid-state imaging device relating to the third embodiment has the same construction as the solid-state imaging device relating to the second embodiment, except for the manufacturing method of the color filter. The following explains the third embodiment with focus on the manufacturing method of the color filter.

FIG. 5 illustrates the manufacturing process of the color filter relating to the third embodiment. FIG. 5 does not show the light-blocking films and the like, similarly to FIG. 4.

To start with, as shown in FIG. 5A, a $TiO_2$ layer 606a, an $SiO_2$ layer 606b, and a $TiO_2$ layer 606c are formed in this order on an insulation layer 604, to form a λ/4 multilayer structure. Furthermore, a resist 60 having a thickness of 2.5 μm is formed in the red and green regions, on the $TiO_2$ layer 606c, similarly to the second embodiment.

After this, an $SiO_2$ layer 606d is formed in the blue, red, and green regions using an RF sputtering device, as shown in FIG. 5B. The $SiO_2$ layer 606d has an optical thickness of 195 nm.

Subsequently, the resist 60 is removed using an organic solvent or the like, as shown in FIG. 5C. This removes a portion of the $SiO_2$ layer 606d which is formed on the resist 60, i.e. the red and green regions of the $SiO_2$ layer 606d (lift off method). As a result, the blue region of the $SiO_2$ layer 606d is left.

After this, a resist 61 is formed in the blue and green regions as shown in FIG. 5D.

Subsequently, an $SiO_2$ layer is formed in the blue, red and green regions as shown in FIG. 5E. This new $SiO_2$ layer has an optical thickness of 45 nm.

After this, the resist 61 is removed. Thus, a portion of the $SiO_2$ layer which is formed on the resist 61, i.e. the blue and green regions of the $SiO_2$ layer are removed. As a result, the red region of the $SiO_2$ layer is left, as shown in FIG. 5F.

Lastly, a $TiO_2$ layer 606e, an $SiO_2$ layer 606f, and a $TiO_2$ layer 606g are formed in this order in the blue, red, and green regions as shown in FIG. 5G.

The above description implies that the manufacturing method relating to the third embodiment can also manufacture the solid-state imaging device relating to the second embodiment. The manufacturing method relating to the third embodiment can produce the same effects as the manufacturing method relating to the second embodiment. Specifically speaking, each of the layers forming the color filter achieves a thickness having unevenness within plus/minus 2%. Furthermore, a solid-state imaging device having high dimensional accuracy can be manufactured.

[4] Fourth Embodiment

The following describes a solid-state imaging device relating to a fourth embodiment of the present invention. Similarly to the third embodiment, the fourth embodiment is characterized by the manufacturing method of the color filter. Here, the solid-state imaging device relating to the fourth embodiment is substantially the same as the solid-state imaging device relating to the second embodiment, but is different in terms of the following feature. According to the second embodiment, the color filter includes an $SiO_2$ layer which extends across the red and blue regions, and has different optical thicknesses respectively in the red and blue regions. On the other hand, according to the fourth embodiment, the color filter includes an $SiO_2$ layer which extends across the red, green, and blue regions, and has different thicknesses respectively in the red, green, and blue regions.

FIG. 6 illustrates the manufacturing method of the color filter relating to the fourth embodiment. To start with, a $TiO_2$ layer 706a, an $SiO_2$ layer 706b, a $TiO_2$ layer 706c, and an $SiO_2$ layer 706d are formed in the stated order on an insulation layer 704, as shown in FIG. 6A. The $TiO_2$ layers 706a and 706c, and $SiO_2$ layer 706b each have an optical thickness of $\lambda/4$, and the $SiO_2$ layer 706d has an optical thickness of 195 nm.

After this, a resist 70 is formed in the green and blue regions on the $SiO_2$ layer 706d. Then, the portion of the $SiO_2$ layer 706d corresponding to the red region is removed by etching, as shown in FIG. 6B. This etching process may be dry etching using a CF gas, or wet etching using hydrofluoric acid.

Subsequently, the resist 70 is removed using an organic solvent or the like, and a resist 71 is formed in the blue region on the $SiO_2$ layer 706d, as shown in FIG. 6C.

After this, an $SiO_2$ layer having an optical thickness of 55 nm is formed in all of the regions using an RF sputtering device, as shown in FIG. 6D.

Subsequently, the resist 71 is removed with the use of an organic solvent or the like. This removes a portion of the $SiO_2$ layer which is formed on the resist 71 (liftoff method), as shown in FIG. 6E. In this way, the optical thickness of the $SiO_2$ layer 706d is 250 nm in the green region, 195 nm in the blue region, and 55 nm in the red region.

Subsequently, a $TiO_2$ layer 706e, an $SiO_2$ layer 706f and a $TiO_2$ layer 706g are formed in this order on the $SiO_2$ layer 706d. Thus, the color filter relating to the fourth embodiment is completed.

The $SiO_2$ layer 706d whose optical thickness changes in three levels, included in the color filter relating to the fourth embodiment, is generally completed by separately forming three different parts different in thickness. However, because of the etching and liftoff methods, the manufacturing method relating to the fourth embodiment only includes two layer formation steps in order to form the $SiO_2$ layer 706d whose optical thickness changes in three levels (55 nm, 195 nm, and 250 nm). As a result, the turnaround time (TAT) can be shortened, and the manufacturing cost can be reduced.

[5] Fifth Embodiment

The following describes a solid-state imaging device relating to a fifth embodiment of the present invention. The solid-state imaging device relating to the fifth embodiment has substantially the same construction as the solid-state imaging device relating to the second embodiment, except for the construction of the color filter.

In the color filter of the solid-state imaging device relating to the second embodiment, the $SiO_2$ and $TiO_2$ layers alternate with each other. In the color filter of the solid-state imaging device relating to the fifth embodiment, however, a magnesium oxide (MgO) layer is additionally formed to adjust a wavelength of light to be transmitted. The following describes the fifth embodiment with focus on the manufacturing method of the color filter.

FIG. 7 illustrates the manufacturing method of the color filter relating to the fifth embodiment. To start with, a $TiO_2$ layer 806a, an $SiO_2$ layer 806b, a $TiO_2$ layer 806c, and an $SiO_2$ layer 806d are formed in the stated order on an insulation layer 804, as shown in FIG. 7A. The $TiO_2$ layers 806a and 806c, and $SiO_2$ layer 806b each have an optical thickness of $\lambda/4$, and the $SiO_2$ layer 806d has an optical thickness of 195 nm.

After this, a resist 80 is formed on the $SiO_2$ layer 806d, and a portion of the resist 80 corresponding to the red region is removed. Subsequently, the portion of the $SiO_2$ layer 806d corresponding to the red region is removed by etching, as shown in FIG. 7B.

Figure 7D:
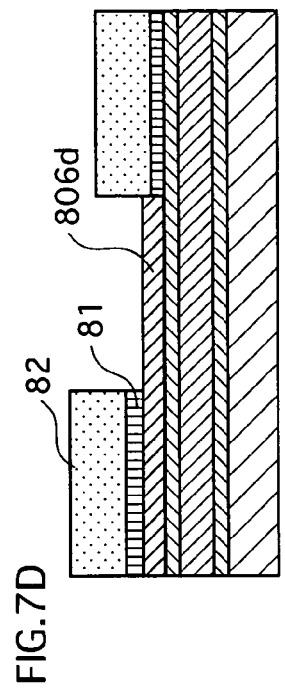
FIGS. 7A-7F are cross-sectional views illustrating a manufacturing method of a color filter relating to a fifth embodiment of the present invention.
Figure 7E:
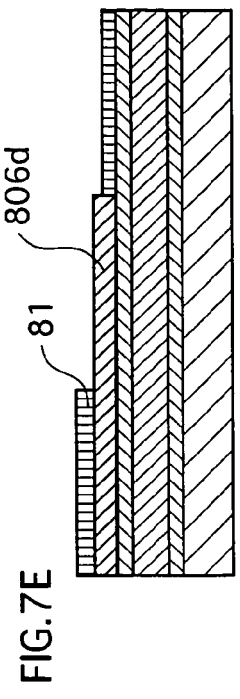
Figure 7F:
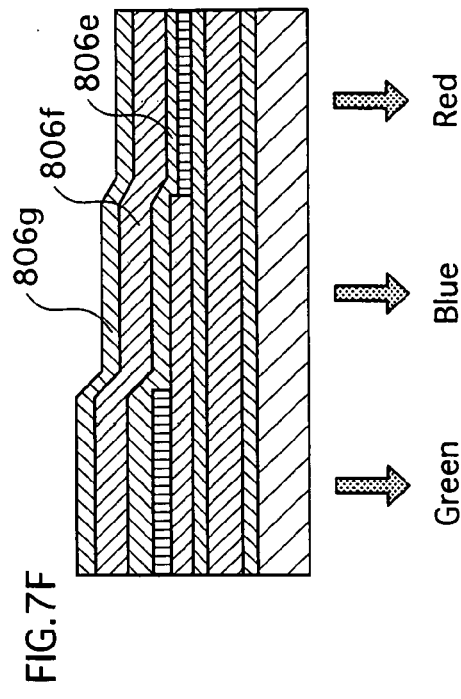
Figure 7A:
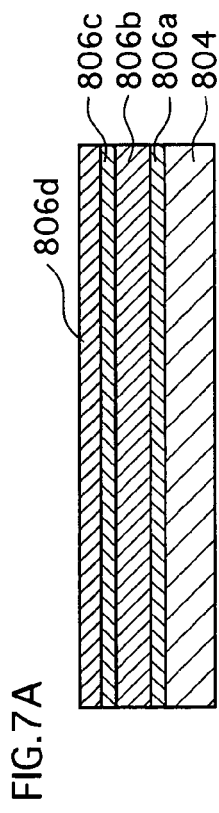
Figure 7B:
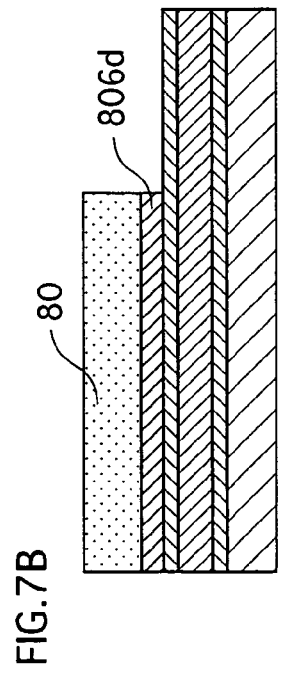
Figure 7C:
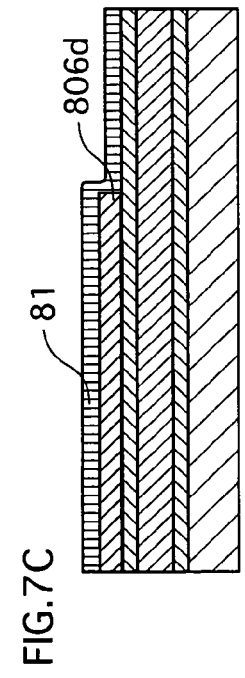

Subsequently, a magnesium oxide layer 81 having an optical thickness 55 nm is formed in all of the regions, using an RF sputtering device, as shown in FIG. 7C.

After this, a resist 82 is formed in the green and red regions, so that the portion of the MgO layer 81 corresponding to the blue region is removed, as shown in FIG. 7D. Here, this portion of the MgO layer 81 can be removed by dry etching with the use of a CF gas, or wet etching with the use of hydrofluoric acid, similarly to the $SiO_2$ layer 706d.

Subsequently, the resist 82 is removed as shown in FIG. 7E, and a $TiO_2$ layer 806e, an $SiO_2$ layer 806f, and a $TiO_2$ layer 806g are formed in this order as shown in FIG. 7F.

As a result, in the green region, the $SiO_2$ layer 806d and MgO layer 81 achieve an optical thickness of 250 nm. In the blue region, the $SiO_2$ layer 806d achieves an optical thickness of 195 nm. In the red region, the MgO layer 81 achieves an optical thickness of 55 nm. Therefore, required filter characteristics can be realized.

According to the fifth embodiment, etching can be selectively performed by means of the two different materials ($SiO_2$ and MgO), which have etching selectivity to each other in terms of etching rate. Therefore, by conducting the formation steps of the $SiO_2$ layer 806d and MgO layer 81 respectively only once, an insulation layer whose optical thickness changes in three levels can be formed. As a result, the TAT can be shortened, and the manufacturing cost can be reduced.

[6] Performance Evaluation

Figure 8:
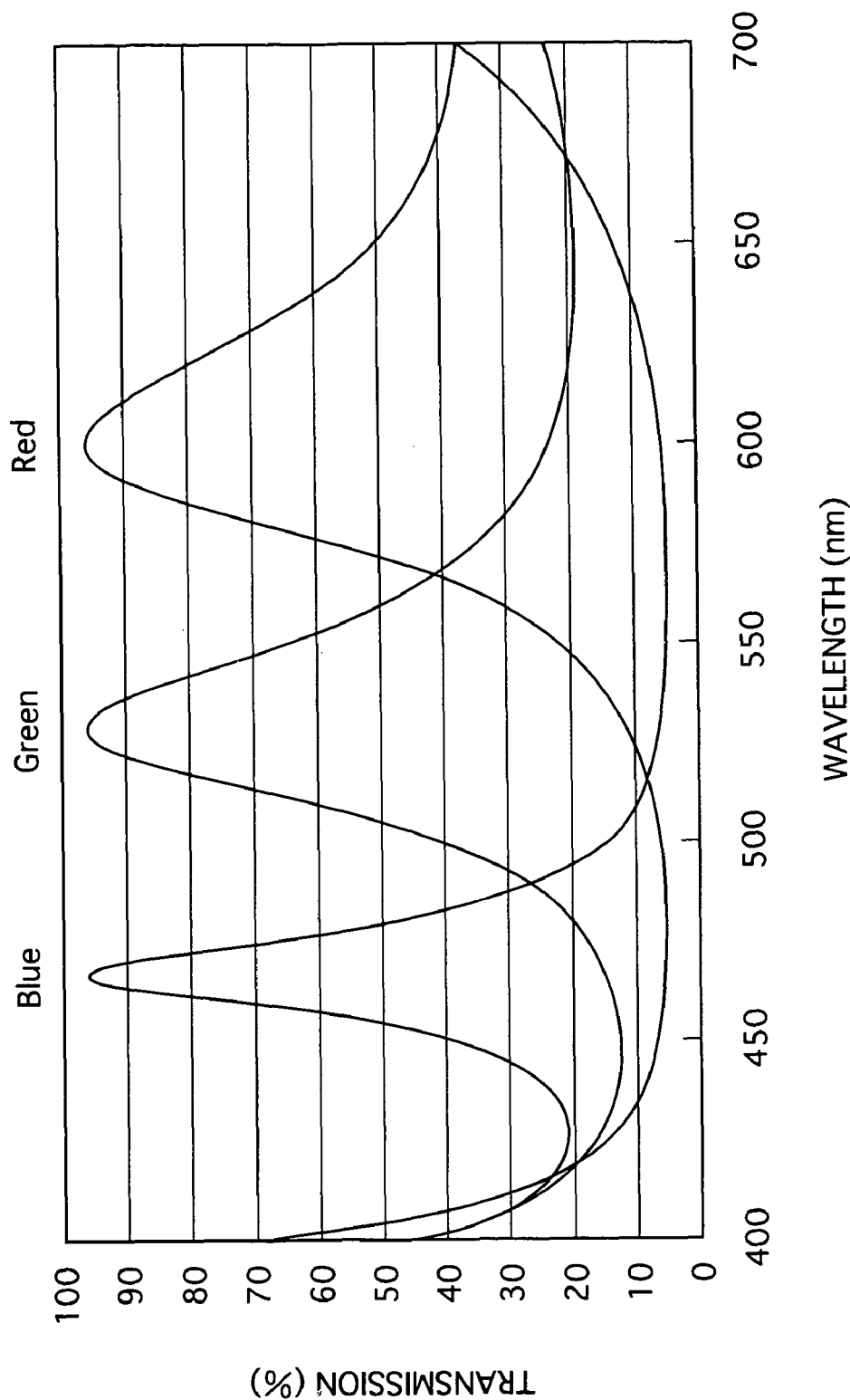
FIG. 8 is a graph illustrating transmission characteristics of the color filter relating to the second embodiment of the present invention.

The following states evaluation results regarding the transmission characteristics of the color filter 406 relating to the second embodiment. It should be noted that the color filter relating to the third embodiment has the same transmission characteristics. FIG. 8 is a graph illustrating the transmission characteristics of the color filter 406 relating to the second embodiment. As seen from FIG. 8, the color filter 406 can precisely separate incoming light into red, green and blue. Even though their evaluation results are not shown, the color filters relating to the fourth and fifth embodiments are confirmed to be able to also precisely separate incoming light into red, green and blue.

Figure 9:
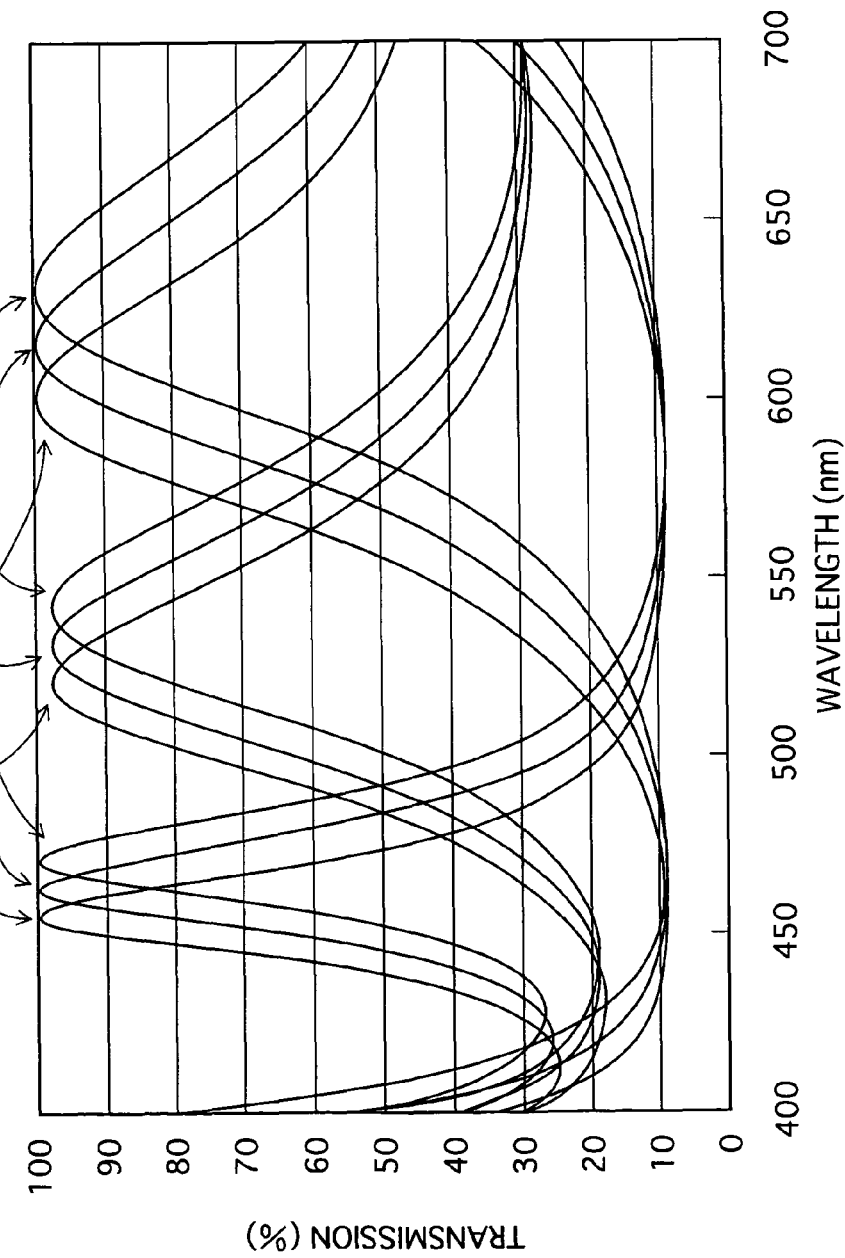
FIG. 9 is a graph illustrating transmission characteristics observed when an optical thickness of a spacer layer in the color filter relating to the second embodiment of the present invention is different from a designed value.

FIG. 9 is a graph illustrating the transmission characteristics observed when the optical thickness of the $SiO_2$ layer 406d (Hereinafter, a layer which is sandwiched between layers having an optical thickness of $\lambda/4$, but does not have an optical thickness of $\lambda/4$ is referred to as "a spacer layer".) in the color filter 406 relating to the second embodiment is different from a designed value, for example, by 0 nm and plus/minus 3 nm.

As seen from FIG. 9, a difference of 3 nm in optical thickness of the space layer causes a change of approximately 10 nm in peak emission wavelength of transmitted light. In other words, if the spacer layer has an optical thickness different from a designed value by 3 nm, an enormous decrease is observed in precision of color separation into red, green and blue. This makes it impossible to utilize the solid-state imaging device for practical use. For this reason, when the spacer layer is formed, its optical thickness needs to be controlled with high accuracy.

According to the manufacturing methods relating to the above embodiments of the present invention, the spacer layer can be formed with high accuracy. This can reduce degradation of wavelength selection characteristics, which is caused when the spacer layer has an optical thickness different from a designed value, thereby preventing a decrease in sensitivity and unevenness of color in smaller-sized solid-state imaging devices.

Conventionally, a solid-state imaging device is manufactured by forming color filters separately from other constituents such as light-receiving elements, and combining them together later. According to the present invention, however, the color filter is also manufactured during a wafer fabrication process, in which the light-receiving elements and the like are manufactured. This can improve the yield ratio, and reduce the manufacturing cost.

Here, as long as the spacer layer has an appropriate optical thickness, the number of layers forming the color filter may be larger or smaller than seven. Furthermore, the numbers of layers on respective sides of the spacer layer may or may not be the same.

Also, the materials of the layers forming the color filter 406 are not limited to $TiO_2$, $SiO_2$, and MgO mentioned in the above description. Alternatively, tantalum oxide ($Ta_2O_5$), zirconium oxide ($ZrO_2$), silicon nitride (SiN), silicon nitride ($Si_3N_4$), aluminum oxide ($Al_2O_3$), magnesium fluoride ($MgF_2$), or hafnium oxide ($HfO_3$) may be used.

[7] Sixth Embodiment

The following describes a solid-state imaging device relating to a sixth embodiment of the present invention. The solid-state imaging device relating to the sixth embodiment has the same construction as the solid-state imaging device relating to the fourth embodiment, except for the manufacturing method of the color filter.

FIG. 10 illustrates the manufacturing method of the color filter relating to the sixth embodiment. As shown in FIG. 10A, a $TiO_2$ layer 906a, an $SiO_2$ layer 906b, a $TiO_2$ layer 906c, an $SiO_2$ layer 906d, and a $TiO_2$ layer 906e are formed in the stated order on an insulation layer 904 using an RF sputtering device. The $TiO_2$ layers 906a and 906c, and $SiO_2$ layers 906b and 906d form a $\lambda/4$ multilayer structure. The $TiO_2$ layer 906e is a spacer layer.

After this, a resist pattern 90 is formed on the spacer layer 906e, so that the red region of the spacer layer 906e is subjected to etching, as shown in FIG. 10B.

Subsequently, as shown in FIG. 10C, the resist pattern 90 is removed, and a resist pattern 91 is then formed, so that the green region of the spacer layer 906e is subjected to etching.

After this, as shown in FIG. 10D, an $SiO_2$ layer 906f, a $TiO_2$ layer 906g, an $SiO_2$ layer 906h, and a $TiO_2$ layer 906i are formed on the spacer layer 906e. Thus, the color filter is completed. The optical thickness of the color filter is 622 nm in the blue region, 562 nm in the red region, and 542 nm in the green region.

(1) Spectral Characteristics

Figure 11:
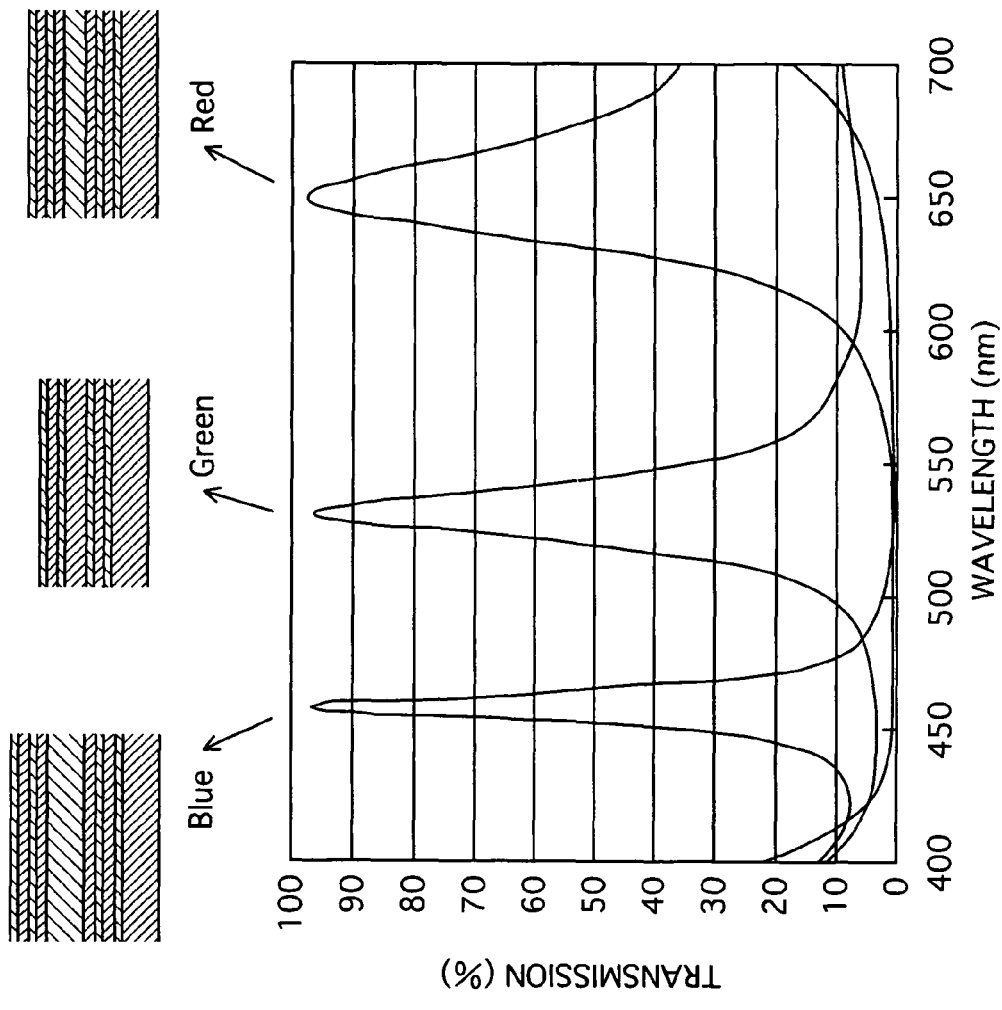
FIG. 11 is a graph illustrating spectral characteristics of the color filter relating to the sixth embodiment of the present invention.

The following describes the spectral characteristics of the color filter relating to the sixth embodiment. FIG. 11 is a graph illustrating the spectral characteristics of the color filter relating to the sixth embodiment. The spectral characteristics are obtained by using a characteristic matrix method, under the assumption that the refractive index of $TiO_2$ (the high refractive index material) is 2.5, the refractive index of $SiO_2$ (the low refractive index material) is 1.45, and the optical and physical thicknesses of the spacer layer are 200 nm and 80 nm in the blue region, 50 nm and 20 nm in the red region, and 0 nm and 0 nm in the green region. Here, it can be said that the $SiO_2$ layers 906d and 906f together having an optical thickness of $\lambda/2$ serve as a spacer layer in the green region.

As seen from FIG. 11, the spacer layer allows different wavelengths of light to transmit in accordance with a difference in thickness.

Note that, the high refractive index material may be silicon nitride, tantalum pentoxide, zirconium dioxide or the like, instead of $TiO_2$, and the low refractive index material may be a material other than $SiO_2$.

(2) Transmission Characteristics

The following describes the transmission characteristics of a dielectric multilayer film. FIG. 12 includes graphs illustrating the transmission characteristics of a dielectric multilayer film including no spacer layer, and of a dielectric multilayer film including a spacer layer. Here, the transmission characteristics shown in FIG. 12 are obtained by using a matrix method based on a Fresnel coefficient, for vertical incoming light only, under the conditions where the number of pairs is ten, and a designed center wavelength is 550 nm. In each graph in FIG. 12, transmittance is plotted along the vertical axis, and a wavelength of light entering a dielectric multilayer film is plotted along the horizontal axis.

Figure 12A:
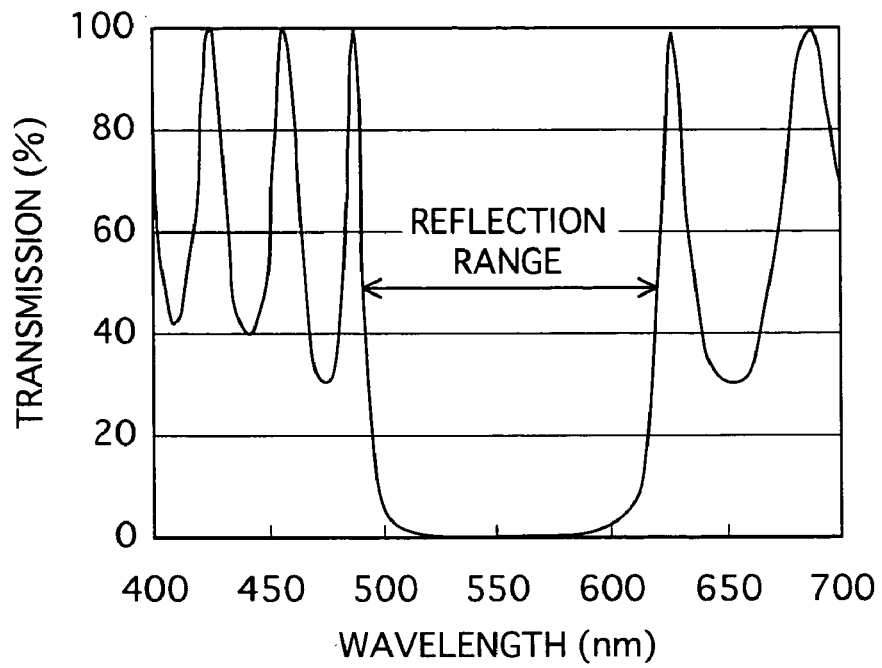
FIGS. 12A-12B show graphs illustrating transmission characteristics of dielectric multilayer films, one of which has a spacer layer, and the other does not.

When the whole dielectric multilayer film composed by silicon nitride and silicon dioxide forms a λ/4 multilayer film, the dielectric multilayer film reflects wavelengths within a range having the designed wavelength as its middle point, as shown in FIG. 12A. Here, this reflection range becomes wider, when the difference in reflection index between the low refractive index and high refractive index materials forming the multilayer film increases.

Figure 12B:
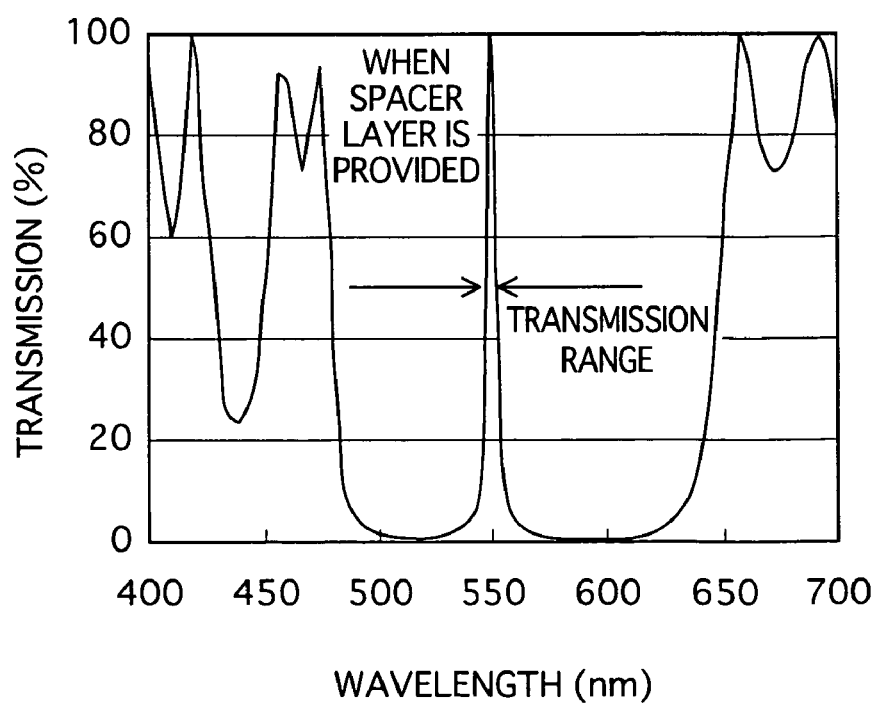
Figure 16D:
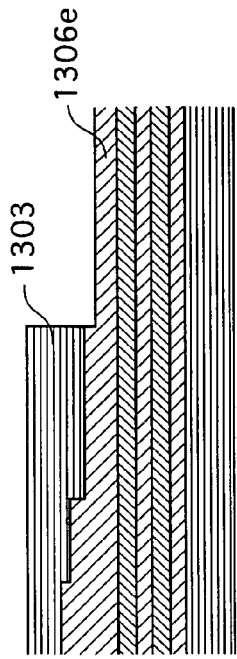
FIGS. 16A-16E are cross-sectional views illustrating a manufacturing method of a color filter relating to a ninth embodiment of the present invention.
Figure 16E:
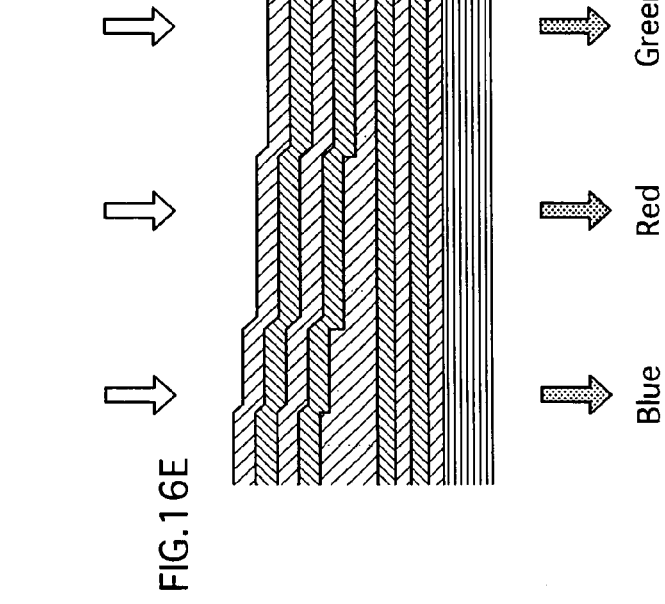
Figure 16A:
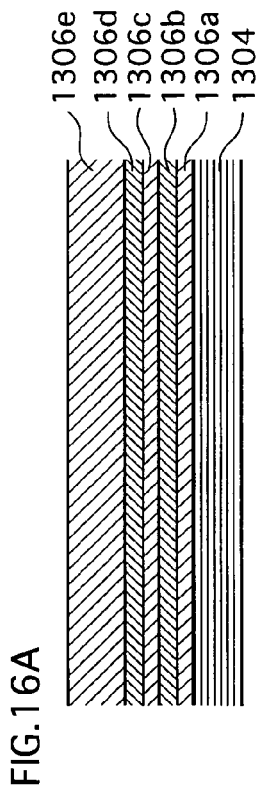
Figure 16B:
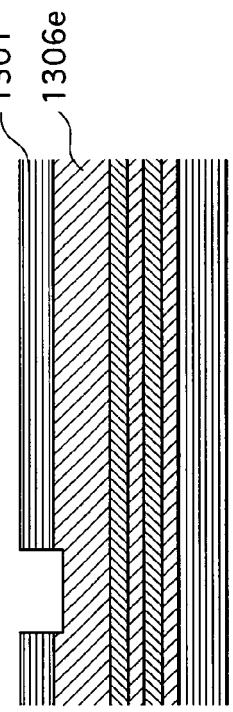
Figure 16C:
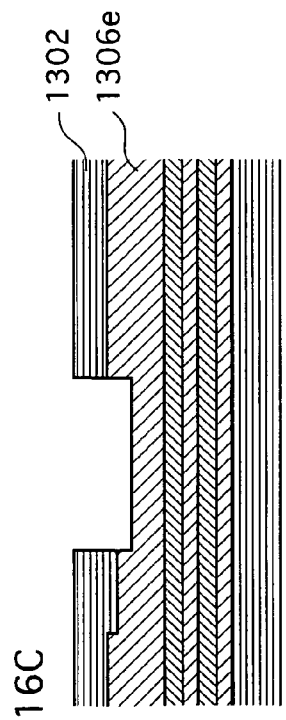

On the other hand, it is assumed that a dielectric multilayer film includes a spacer layer whose optical thickness is not λ/4, and λ/4 multilayer films that are symmetrically structured on the lower and upper sides of the spacer layer. This construction realizes a color filter which transmits wavelengths in the vicinity of the designed wavelength, within the reflection range of the respective λ/4 multilayer films, as shown in FIG. 12B. When the thickness of the spacer layer changes, the color filter transmits a different peak emission wavelength of light.

Taking this feature into consideration, the color filter relating to the sixth embodiment is formed by using a dielectric multilayer film. Hence, the thickness of the color filter is substantially equal to a wavelength of incoming light (approximately 500 nm). As a consequence, the sixth embodiment can attain a smaller-sized solid-state imaging device, and effectively prevent degradation of color separation caused by oblique light.

Also, the color filter can be formed during a wafer fabrication process, in which the light-receiving elements and the like are formed, according to the sixth embodiment. This can achieve solid-state imaging devices with stable quality, and reduce the manufacturing cost.

[8] Seventh Embodiment

The following describes a seventh embodiment of the present invention. A solid-state imaging device relating to the seventh embodiment has substantially the same construction as the solid-state imaging devices relating to the above embodiments, except for the construction of the spacer layer included in the color filter. According to the above embodiments, the wavelength of light which the color filter transmits is adjusted exclusively by changing the thickness of the spacer layer. According to the seventh embodiment, however, the wavelength of light which the color filter transmits is adjusted by forming the spacer layer using two different materials without changing the thickness. In other words, two kinds of materials different in refractive index are alternately arranged in a direction parallel to the main surface of the substrate, according to the seventh embodiment, in order to adjust the wavelength of light which the color filter transmits.

FIG. 13 illustrates the manufacturing method of the color filter relating to the seventh embodiment. To start with, a TiO$_2$ layer 1006a, an SiO$_2$ layer 1006b, a TiO$_2$ layer 1006c, an SiO$_2$ layer 1006d, and a TiO$_2$ layer 1006e are formed on an insulation layer 1004, as shown in FIG. 13A. The TiO$_2$ layer 1006e is a spacer layer.

After this, a resist pattern 1000 is formed on the TiO$_2$ layer 1006e as shown in FIG. 13B.

Subsequently, the TiO$_2$ layer 1006e is subjected to etching with the use of the resist pattern 1000. In this way, a plurality of through holes or grooves are formed in the red region of the TiO$_2$ layer 1006e. Here, the through holes or grooves are arranged in a direction parallel to the main surface of the TiO$_2$ layer 1006e. When the red region of the TiO$_2$ layer 1006e is seen two-dimensionally in plane, the ratio in area between a removed part (the grooves) and a non-removed part is 4:1. Based on this, the refractive index of the red region of the TiO$_2$ layer 1006e is defined by the following expression.

((the refractive index of SiO$_2$)×4/5)+((the refractive index of TiO$_2$)×1/5)

Here, the green region of the TiO$_2$ layer 1006e is completely removed by the etching process.

After this, an SiO$_2$ layer 1006f, a TiO$_2$ layer 1006g, an SiO$_2$ layer 1006h, and a TiO$_2$ layer 1006i are formed in this order on the TiO$_2$ layer 1006e, and a portion of the SiO$_2$ layer 1006d which is exposed due to the removal of the green region of the TiO$_2$ layer 1006e. Thus, the color filter is completed.

According to the seventh embodiment, fewer steps are required for manufacturing the solid-state imaging device. This can shorten the TAT, and reduce the manufacturing cost.

[9] Eighth Embodiment

The following describes a solid-state imaging device relating to an eighth embodiment of the present invention. The solid-state imaging device relating to the eighth embodiment has substantially the same construction as the solid-state imaging devices relating to the above embodiments, but is different in that the color filter collects incoming light toward light-receiving elements.

FIG. 14 illustrates the manufacturing process of the color filter relating to the eighth embodiment. To start with, a TiO$_2$ layer 1106a, an SiO$_2$ layer 1106b, a TiO$_2$ layer 1106c, an SiO$_2$ layer 1106d, and a TiO$_2$ layer 1106e are formed on an insulation layer 1104, as shown in FIG. 14A. Here, the TiO$_2$ layer 1106e is a spacer layer.

After this, a resist pattern 1100 is formed on the TiO$_2$ layer 1106e. Then, the red region of the TiO$_2$ layer 1106e is subjected to etching, as shown in FIG. 14B.

Subsequently, a resist pattern 1101 is formed on the TiO$_2$ layer 1106e. Then, the green region of the TiO$_2$ layer 1106e is subjected to etching, as shown in FIG. 14C.

After this, a resist pattern 1102 is formed on the TiO$_2$ layer 1106e, in the center of each of the red, green, and blue regions, as shown in FIG. 14D.

Subsequently, each of the red, green and blue regions of the TiO$_2$ layer 1106e is processed to have inclined lateral surfaces, using photolithography and dry etching, as shown in FIG. 14E.

Lastly, the resist pattern 1102 is removed, and an SiO$_2$ layer 1106f, a TiO$_2$ layer 1106g, an SiO$_2$ layer 1106h, and a TiO$_2$ layer 1106i are formed. Thus, the color filter is completed. Here, each of the red, green and blue regions of the TiO$_2$ layer 1106e has inclined lateral surfaces as mentioned above. Therefore, each of the red, green and blue regions of the lamination made up by the SiO$_2$ layer 1106f, the TiO$_2$ layer 1106g, the SiO$_2$ layer 1106h, and the TiO$_2$ layer 1106i also has inclined lateral surfaces.

With such inclined lateral surfaces, light that enters the color filter through the lateral surfaces of each of the red, green and blue regions is collected to the center of each region. Accordingly, the eighth embodiment can prevent degradation of color separation caused by oblique light more reliably. In addition, the color filter relating to the eighth embodiment can partly function as a micro lens, by collecting incoming light. As a result, micro lenses with a smaller thickness can be utilized, to realize a smaller-sized solid-state imaging device.

The following describes an alternative manufacturing method to realize the color filter whose red, green and blue regions each have inclined lateral surfaces. FIG. 15 illustrates this alternative manufacturing method of the color filter whose red, green, and blue regions each have inclined lateral surfaces. The steps shown in FIGS. 15A to 15C are the same as those shown in FIGS. 14A to 14C. After the step shown in FIG. 15C, a resist pattern 1203 whose respective portions corresponding to the red, green and blue regions each have inclined lateral surfaces is formed, as shown in FIG. 15D. The steps shown in FIGS. 15E and 15F are the same as those shown in FIGS. 14E and 14F. This alternative manufacturing method can also attain the above-described color filter.

The manufacturing methods relating to the eighth embodiment can achieve a smaller-sized solid-state imaging device, improve the yield ratio, and reduce the manufacturing cost, similarly to the manufacturing methods relating to the above embodiments.

[10] Ninth Embodiment

The following describes a ninth embodiment of the present invention. A solid-state imaging device relating to the ninth embodiment has substantially the same construction as the solid-state imaging devices relating to the above embodiments, except for the shape of the spacer layer included in the color filter. According to the above embodiments, the thickness of the spacer layer is uniform within each of the red, green and blue regions. According to the ninth embodiment, however, the thickness of the spacer layer changes in multiple levels within one color region, so that this region of the color filter can transmit a wider waveband of light.

FIG. 16 illustrates the manufacturing method of the color filter relating to the ninth embodiment. The manufacturing method relating to the ninth embodiment has an additional step of removing part of the blue region of a $TiO_2$ layer 1306e by etching with the use of a resist pattern 1301, as shown in FIG. 16B. Because of this additional step, the thickness of the blue region of the $TiO_2$ layer 1306e changes in two levels. This enables the color filter to pass a wider wavelength range of blue light, thereby enhancing the transmission characteristics.

According to the above description, the thickness of the blue region of the spacer layer changes in two levels, but the ninth embodiment is not limited to such. The thickness of the blue region of the spacer layer may be changed in three or more levels. Furthermore, it may be the red or/and green regions of the spacer layer whose thickness changes in multiple levels.

In addition, the high refractive index material may be silicon nitride, tantalum pentoxide, zirconium dioxide, or the like, instead of $TiO_2$, and the low refractive index material may be a material other than $SiO_2$.

The ninth embodiment can achieve a color filter having a small thickness substantially equal to a wavelength of incoming light. As a result, degradation of color separation caused by oblique light can be prevented, and a smaller-sized solid-state imaging device can be realized. Furthermore, the yield ratio is improved, and the manufacturing cost is reduced.

[11] Tenth Embodiment

The following describes a tenth embodiment of the present invention. A solid-state imaging device relating to the tenth embodiment has substantially the same construction as the solid-state imaging devices relating to the above embodiments, but is different in terms of that the thickness of the spacer layer is continuously changed.

FIG. 17 illustrates the manufacturing method of the color filter relating to the tenth embodiment. To start with, a $TiO_2$ layer 1406a, an $SiO_2$ layer 1406b, a $TiO_2$ layer 1406c, an $SiO_2$ layer 1406d, and a $TiO_2$ layer 1406e are formed in the stated order on an insulation layer 1404, as shown in FIG. 17A.

Figure 17A:
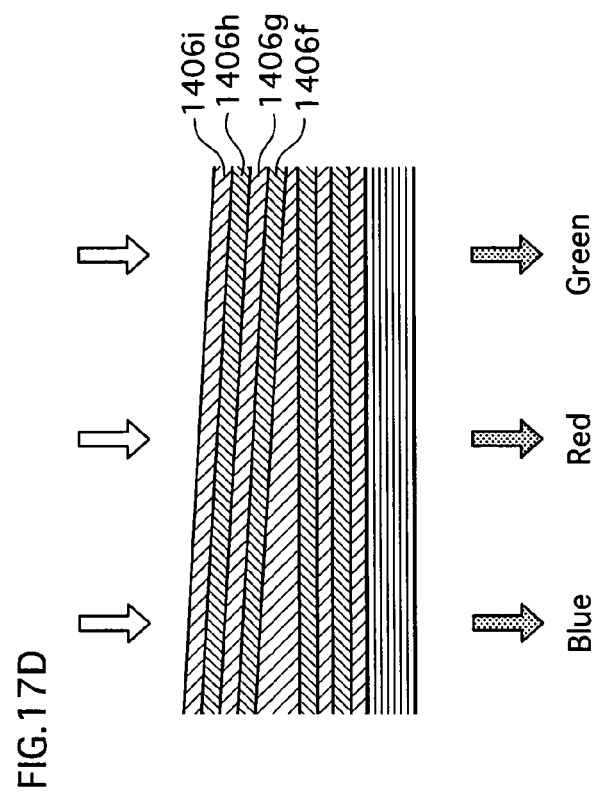
FIGS. 17A-17D are cross-sectional views illustrating a manufacturing method of a color filter relating to a tenth embodiment of the present invention.
Figure 17B:
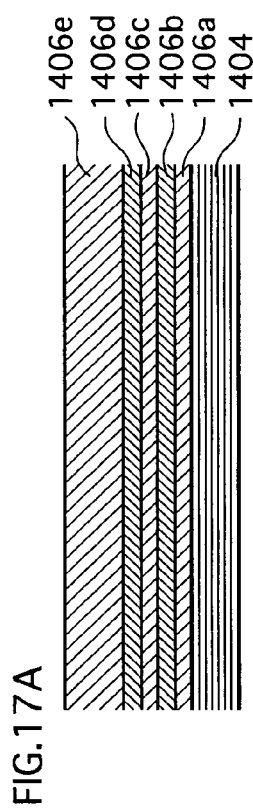

After this, a resist pattern 1401 whose thickness gradually decreases from the blue region toward the green region is formed using photolithography, as shown in FIG. 17B. Regarding a photomask used for the photolithography process, the transmittance of a chrome (Cr) film formed on the photomask is continuously changed, in order to gradually change transmission characteristics of light during exposure, in accordance with the gradual decrease in thickness of the resist pattern 1401.

Figure 17C:
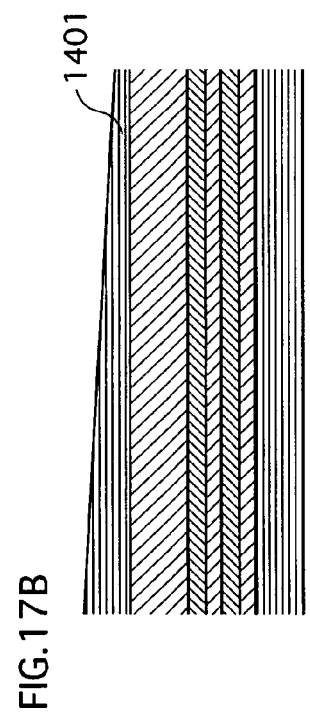

Subsequently, the $TiO_2$ layer 1406e is subjected to dry etching, so that its thickness is gradually decreased in accordance with the shape of the resist pattern 1401, as shown in FIG. 17C.

Figure 17D:
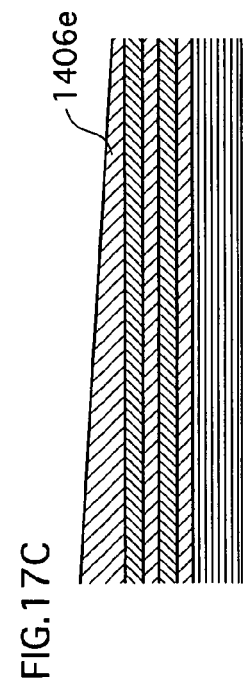

Lastly, an $SiO_2$ layer 1406f, a $TiO_2$ layer 1406g, an $SiO_2$ layer 1406h, and a $TiO_2$ layer 1406i are formed in this order on the $TiO_2$ layer 1406e, as shown in FIG. 17D. Thus, the color filter is completed.

The tenth embodiment can further improve passband characteristics.

[12] Eleventh Embodiment

The following describes an eleventh embodiment of the present invention. A solid-state imaging device relating to the eleventh embodiment has substantially the same construction as the solid-state imaging devices relating to the above embodiments, but is different in terms of having an absorbing member that absorbs light reflected by the color filter.

FIG. 18 illustrates the manufacturing method of the color filter relating to the eleventh embodiment. The steps shown in FIGS. 18A to 18C have been described in the above embodiments.

As shown in FIG. 18D, the color filter relating to the eleventh embodiment has absorbing members 1507b, 1507r, and 1507g for the respective colors, on a $TiO_2$ layer 1506i. The absorbing members 1507b, 1507r and 1507g may be realized using a color filter containing pigments or dyes, for example.

As described above, a color filter that is formed by a dielectric multilayer film only transmits particular wavelengths of light, and reflects other wavelengths. The reflected light may enter a wrong light-receiving element as a result of multiple reflection at the surface of the solid-state imaging device, for example. This problem can be solved by the eleventh embodiment, where the absorbing members are provided on the color filter. As a consequence, the eleventh embodiment can reduce occurrence of noise caused by such reflected light.

[13] Modification Examples

The present invention is not limited to the above-described embodiments, and includes the following modification examples.

(1) According to the above description of the embodiments, the outmost layer in the color filter is always made of the high refractive index material ($TiO_2$). However, the present invention is not limited to such, and the outmost layer may be made of the low refractive index material.

FIG. 19 illustrates the manufacturing method of the color filter whose outmost layer is made of the low refractive index material. To start with, a $TiO_2$ layer 1606a, an $SiO_2$ layer 1606b, a $TiO_2$ layer 1606c, and an $SiO_2$ layer 1606d are formed on an insulation layer 1604, as shown in FIG. 19A.

Figure 19A:
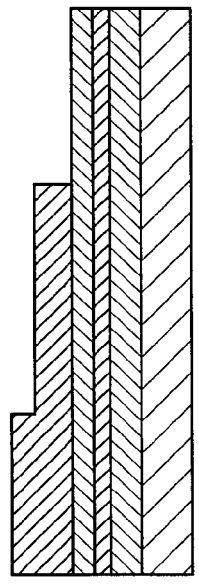
FIGS. 19A-19D are cross-sectional views illustrating a manufacturing method of a color filter relating to a modification example (1) of the present invention.
Figure 19B:
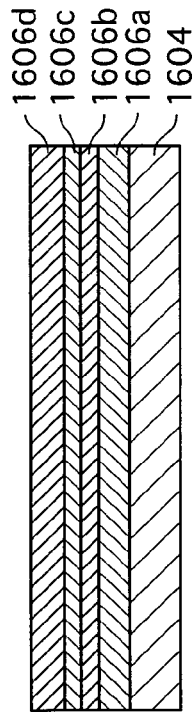
Figure 19C:
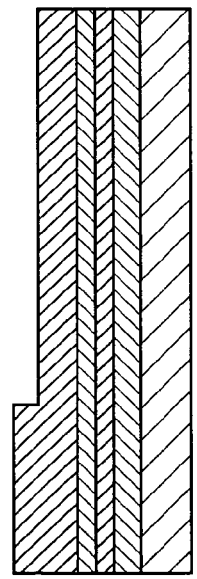
Figure 19D:
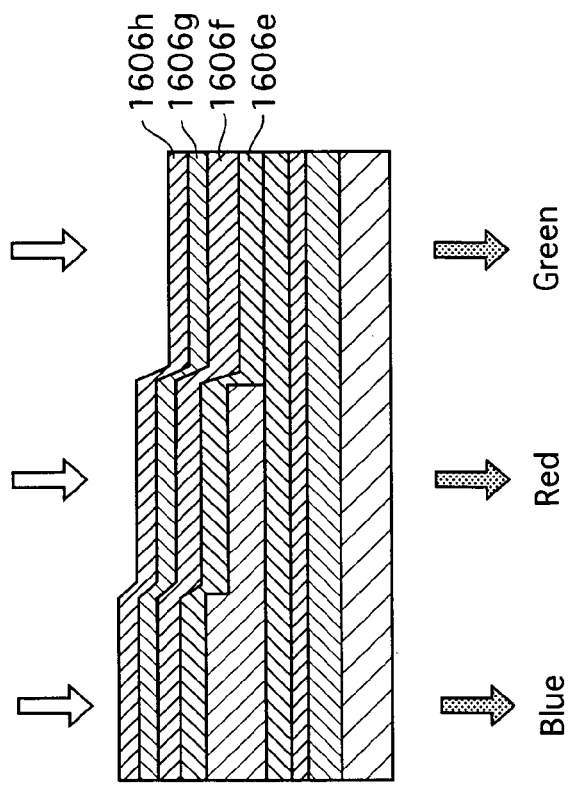

After this, the thickness of the SiO$_2$ layer 1606*d*, which is a spacer layer, is adjusted by etching as shown in FIGS. 19B and 19C. Lastly, a TiO$_2$ layer 1606*e*, an SiO$_2$ layer 1606*f*, a TiO$_2$ layer 1606*g*, and an SiO$_2$ layer 1606*h* are formed, on the SiO$_2$ layer 1606*d* and the green region of the TiO$_2$ layer 1606*c*, as shown in FIG. 19D.

FIG. 20 is a graph illustrating the transmission characteristics of the color filter relating to this modification example. The comparison of FIG. 20 with FIG. 8 shows that the peak transmittance of each of blue light and red light is improved to approximately 100%, and that the peak transmittance of green light is also improved toward 100%.

According to this modification example, incoming light is less likely to be reflected by the outmost layer in the color filter, when compared with the case where the outmost layer is made of the high refractive index material. As a result, more efficient imaging can be performed. Also, it has been confirmed that the spacer layer made of the low refractive index material achieves better spectral sensitivity than the spacer layer made of the high refractive index material.

Figure 21:
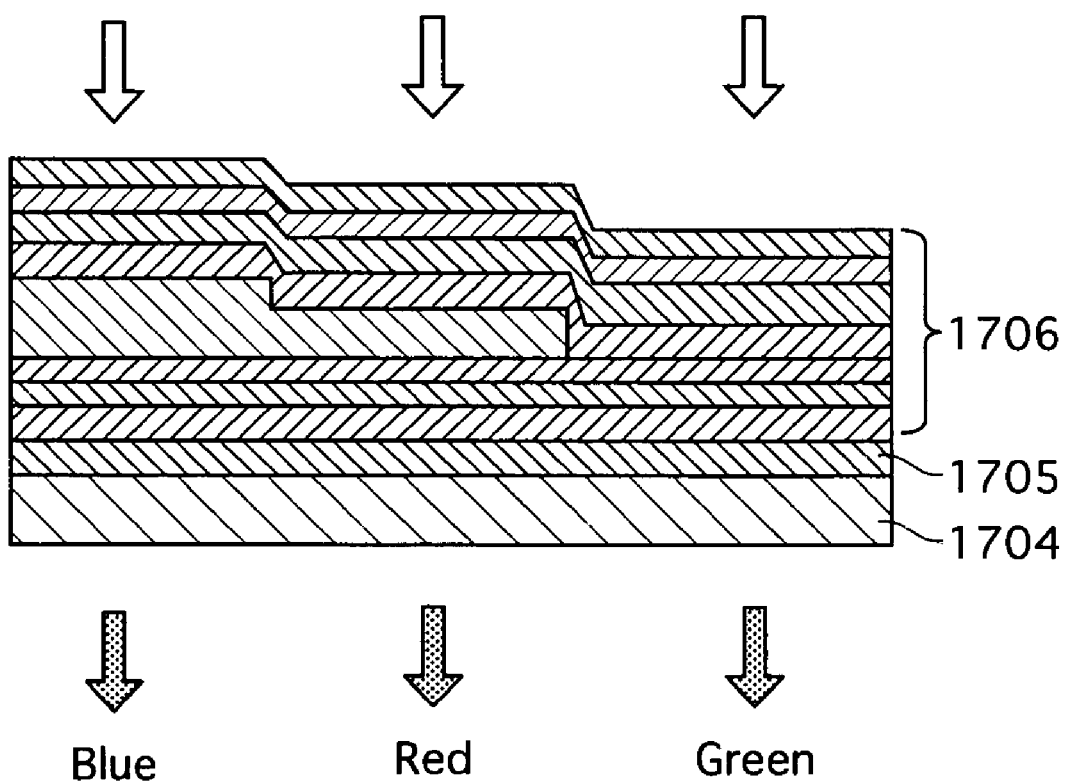
FIG. 21 is a cross-sectional view illustrating a construction of a color filter relating to a modification example (2) of the present invention.

(2) The above description of the embodiments does not make reference to a protective layer, but a protective layer may be formed on the surface of the color filter which faces the insulation layer or micro lenses, or within the color filter. By forming a protective layer (for example, a silicon nitride layer) in such a position, the solid-state imaging device can have improved reliability and moisture resistance. FIG. 21 is a cross-sectional view illustrating the color filter relating to this modification example. As shown in FIG. 21, a protective layer 1705, and a color filter 1706 are formed in this order on an insulation layer 1704. Here, the protective layer 1705 is made of silicon nitride.

Figure 22:
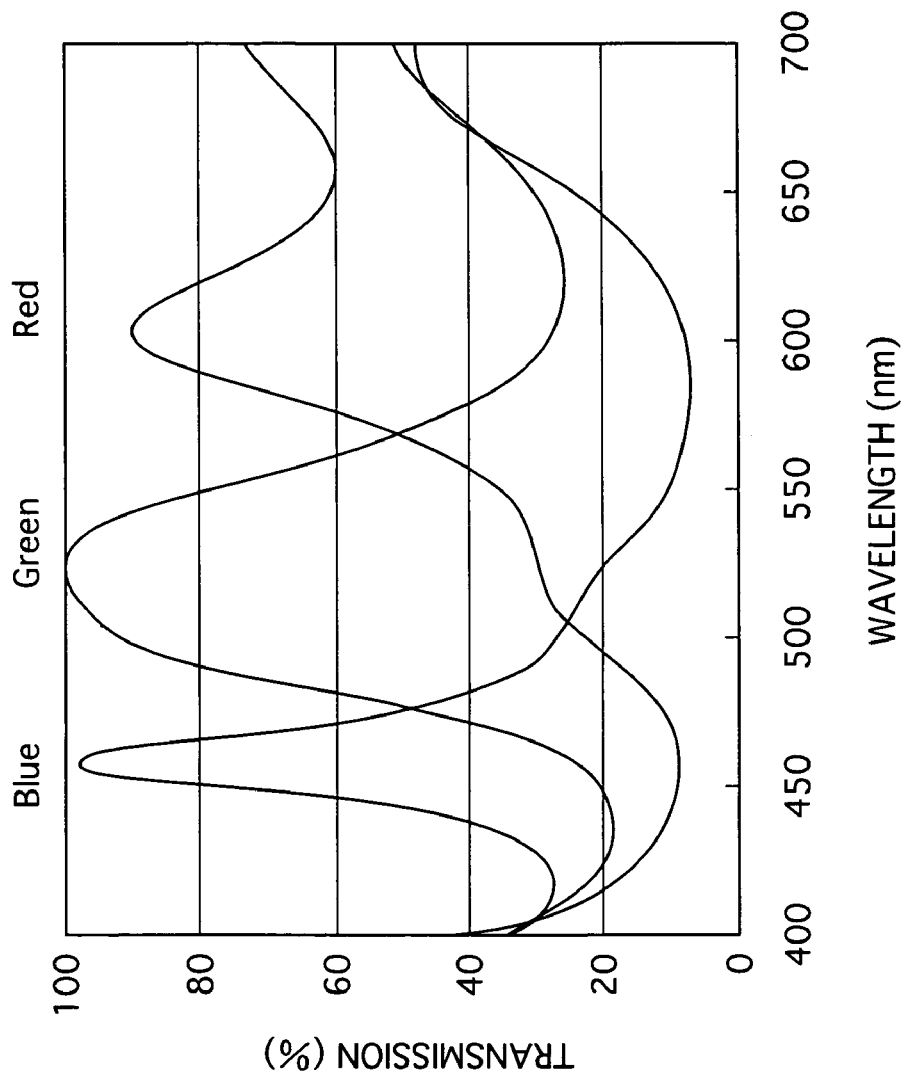
FIG. 22 is a graph illustrating transmission characteristics of the color filter relating to the modification example (2) of the present invention.

FIG. 22 is a graph illustrating the transmission characteristics of the color filter relating to this modification example. As seen from FIG. 22, the addition of the protective layer 1705 does not cause significant degradation in the transmission characteristics.

As mentioned above, addition of a protective layer achieves a solid-state imaging device having improved reliability and moisture resistance.

(3) According to the above description of the embodiments, the surface of the color filter which faces the micro lenses is always shaped in the same manner as the surface of the spacer layer, when seen cross-sectionally. The present invention is not limited to such, and includes the following modification example.

Figure 23:
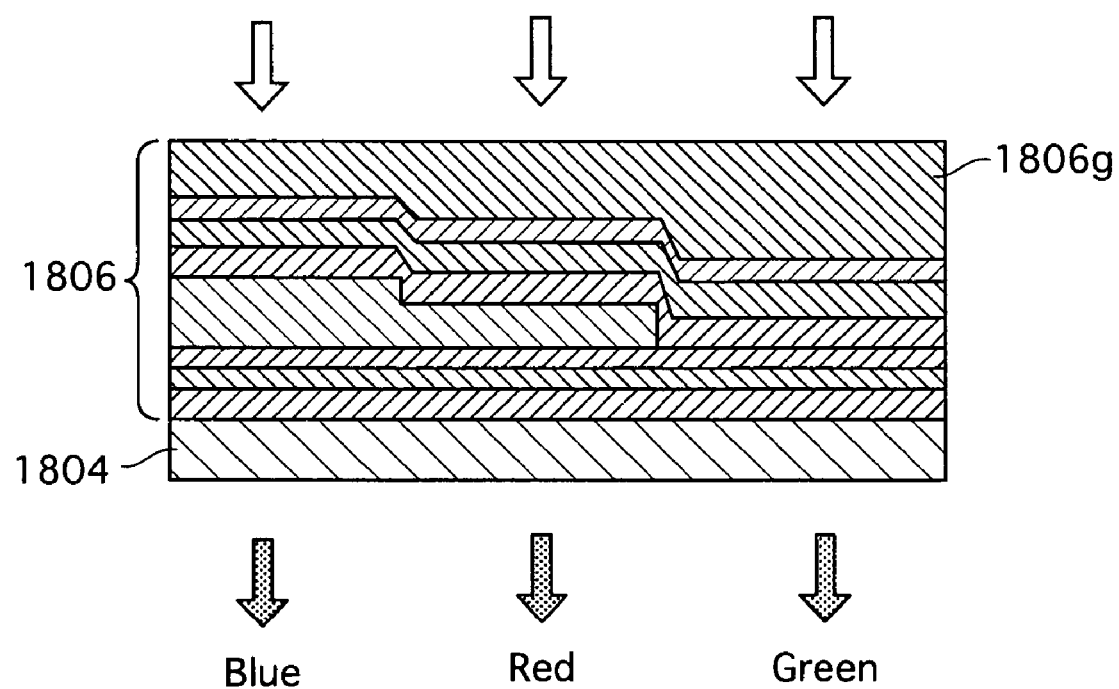
FIG. 23 is a cross-sectional view illustrating a construction of a color filter relating to a modification example (3) of the present invention.

FIG. 23 shows the color filter relating to this modification example. As shown in FIG. 23, TiO$_2$ layers and SiO$_2$ layers alternate with each other, and are formed on an insulation layer 1804, in a color filter 1806 relating to this modification example. In addition, an SiO$_2$ layer 1806*g* whose thickness is adjusted in accordance with the uneven surface of the color filter 1806 is formed on the surface of the color filter 1806 which faces the micro lenses. Here, the surface of the SiO$_2$ layer 1806*g* which faces the micro lenses is flat.

Figure 24:
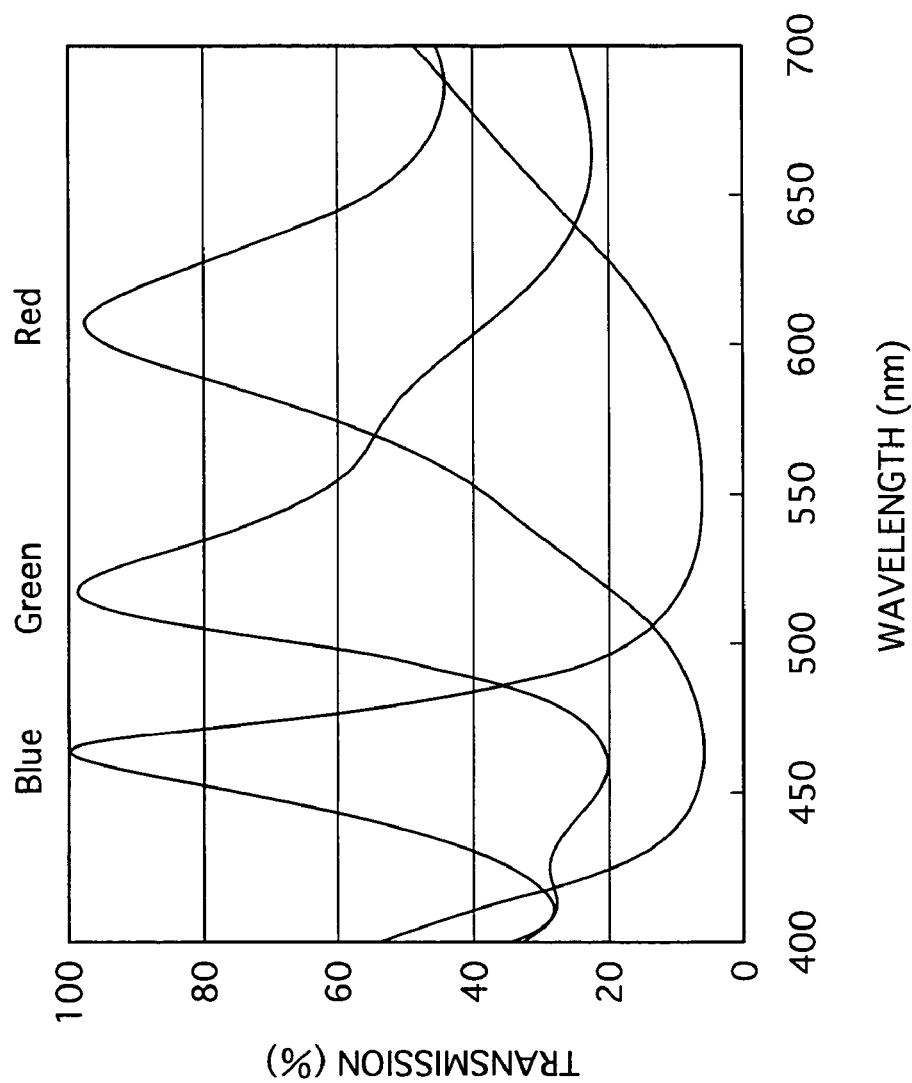
FIG. 24 is a graph illustrating transmission characteristics of the color filter relating to the modification example (3) of the present invention.

FIG. 24 is a graph illustrating the transmission characteristics of the color filter 1806. As seen from FIG. 24, the color filter 1806 has excellent transmission characteristics, despite of the presence of the SiO$_2$ layer 1806*g*.

With this construction, the micro lenses can be easily formed. As a result, the yield ratio can be improved, and the manufacturing cost can be reduced. Furthermore, it is no longer required to use micro lenses having a different focal length for each color.

(4) According to the above description of the embodiments, the color filter is always formed on the insulation layer. However, the present invention is not limited to such, and includes the following modification example.

Figure 25:
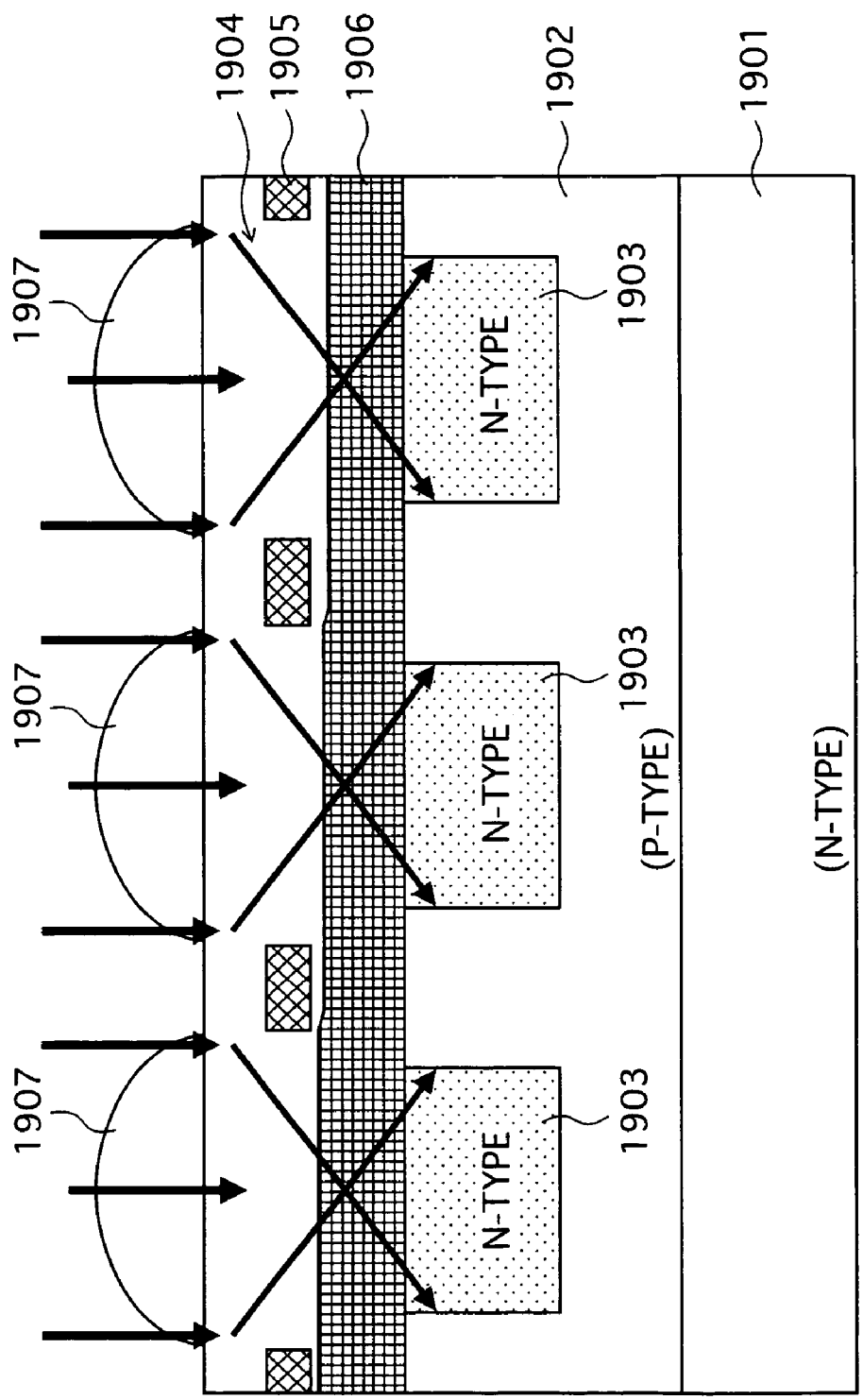
FIG. 25 is a cross-sectional view illustrating a construction of a solid-state imaging device relating to a modification example (4) of the present invention.

In short, the color filter may be formed so as to be in contact with the light-receiving elements. FIG. 25 is a cross-sectional view illustrating a construction of a solid-state imaging device relating to this modification example.

Figure 26:
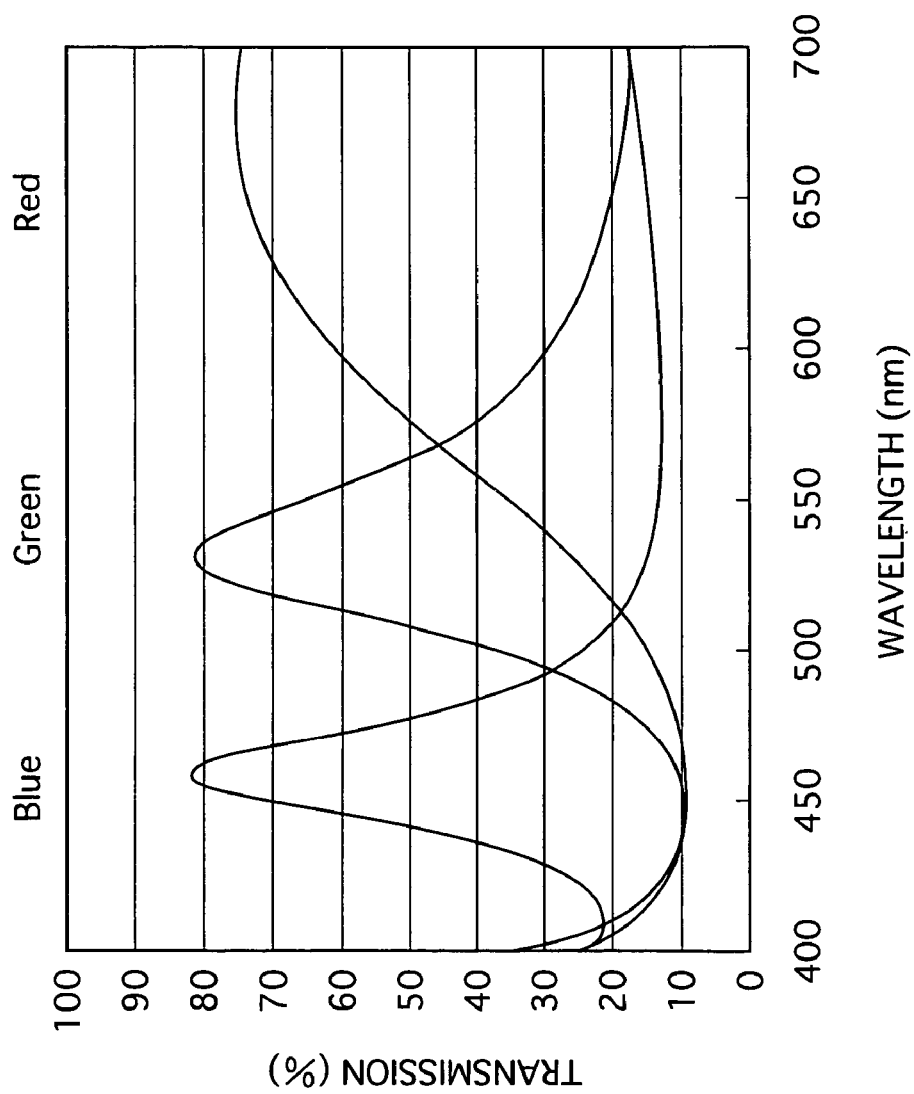
FIG. 26 is a graph illustrating transmission characteristics of a color filter relating to the modification example (4) of the present invention.

As shown in FIG. 25, the solid-state imaging device relating to this modification example includes an N-type semiconductor substrate 1901, a P-type semiconductor layer 1902, light-receiving elements 1903, a color filter 1906, an insulation layer 1904, light-blocking films 1905, and micro lenses 1907. FIG. 26 is a graph illustrating the transmission characteristics of the color filter 1906. FIG. 26 confirms that there is no particular degradation in the transmission characteristics of the color filter 1906 relating to this modification example.

According to this modification example, the color filter is formed so as to be in contact with the light-receiving elements. This can prevent degradation of color separation due to oblique light, more reliably.

Here, the distance from the surface of the semiconductor to the high refractive index layer in the color filter may be no less than 1 nm, but no more than a wavelength of light which the color filter transmits. Between the surface of the semiconductor and the high refractive index layer in the color filter, a low refractive index layer forming the color filter or a buffer layer may be provided. When the high refractive index layer in the color filter is a TiO$_2$ layer, and the low refractive index layer is an SiO$_2$ layer, for example, the distance from the TiO$_2$ layer to the light-receiving elements (the surface of the semiconductor) may preferably fall within the above range. In other words, it is desirable that the optical thickness of the SiO$_2$ layer in contact with the light-receiving elements falls within the above range.

(5) According to the above description of the embodiments, the color filter is formed in such a manner that the TiO$_2$ and SiO$_2$ layers alternate with each other. In such a color filter, either one of TiO$_2$ and SiO$_2$ layers can be a spacer layer.

Figure 27:
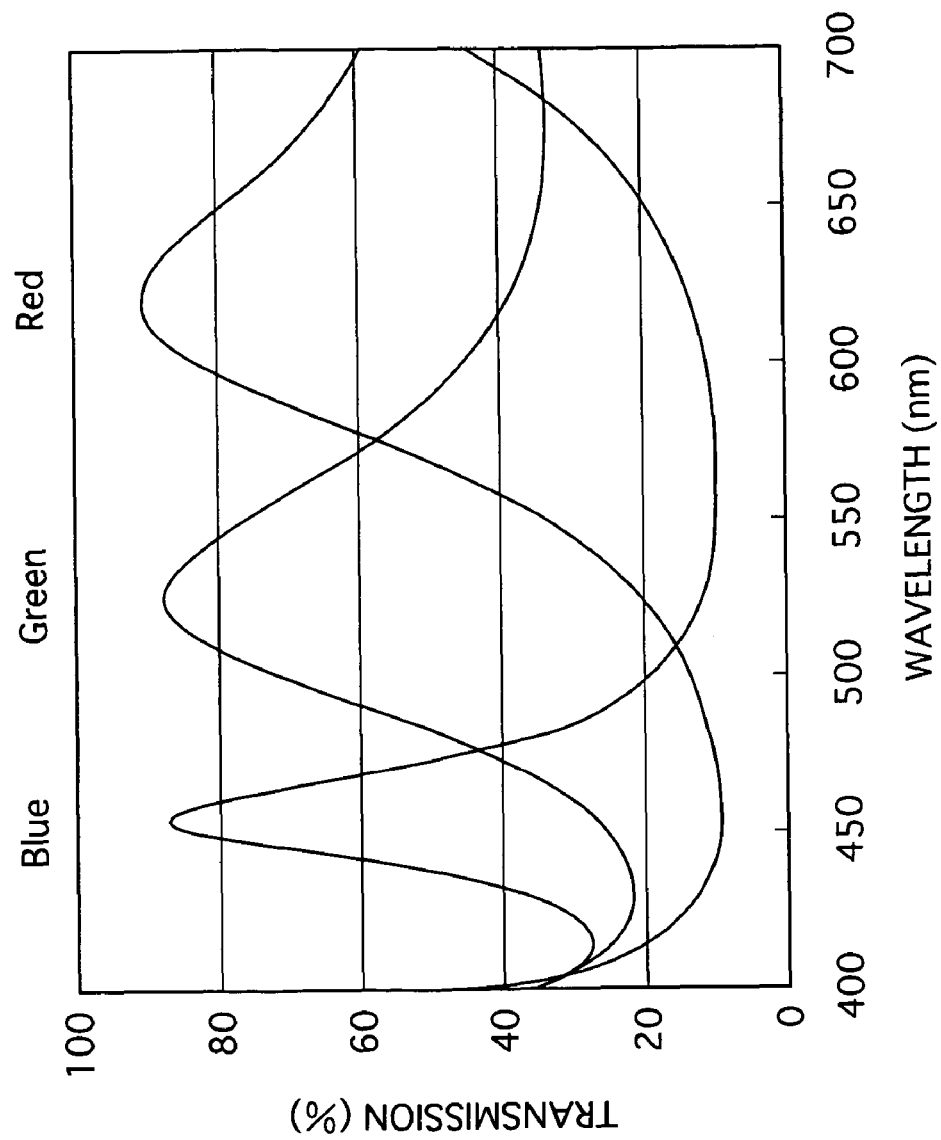
FIG. 27 is a graph illustrating transmission characteristics of a color filter relating to a modification example (5) of the present invention.

However, it is more preferable that the spacer layer is an SiO$_2$ layer, from the aspect of transmittance. FIG. 27 is a graph illustrating the transmission characteristics of the color filter whose spacer layer is a TiO$_2$ layer. As seen from FIG. 27, when the spacer layer is a TiO$_2$ layer, the peak transmittance of none of blue, green, and red reaches 90%.

On the other hand, when the spacer layer is an SiO$_2$ layer, the peak transmittance of each of blue, green, and red is 95% or higher, as seen from FIG. 8, for example. For these reasons, the spacer layer in the color filter formed by stacking SiO$_2$ and TiO$_2$ layers alternately is preferably an SiO$_2$ layer.

Here, the optical thickness of the spacer layer is preferably no more than a wavelength of light which the color filter transmits, but no less than 1 nm. By varying the optical thickness of the spacer layer within this range, the peak wavelength of light which the color filter transmits can be freely set within the visible region.

(6) The above description of the embodiments only briefly states that red, green and blue regions of the color filter are arranged in Bayer array. The following specifically describes a desirable arrangement of red, green, and blue regions of the color filter.

Figure 28:
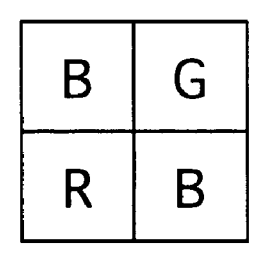

FIG. 28 illustrates an arrangement of red, green and blue regions of the color filter, relating to this modification example, in detail, showing a minimum unit (four pixels) of Bayer array. In the same manner as in this minimum unit, all pixels are arranged. As seen from FIG. 28, two pixels out of the four pixels forming the minimum unit of Bayer array detect blue light, and the remaining two pixels respectively detect red light and green light.

Considering its transmission characteristics, the color filter has a smaller full width at half maximum for blue light than for red or green light. By employing the above arrangement, however, the waveband to detect blue light can be widened, which results in higher sensitivity of the solid-state imaging device.

(7) According to the seventh embodiment, the grooves are formed in the red region of the $TiO_2$ layer, and the grooves are filled with $SiO_2$. However, the present invention is not limited to such, and includes the following modification example. As an alternative example, depressions may be provided in the $TiO_2$ layer, in place of the grooves, and filled with $SiO_2$. In this case, the refractive index of this region of the $TiO_2$ layer can be also defined by the expression shown in the seventh embodiment. As another alternative example, the grooves may be formed concentrically.

[14] $\lambda/4$ Multilayer Structure

The following describes a $\lambda/4$ multilayer structure.

Figure 29:
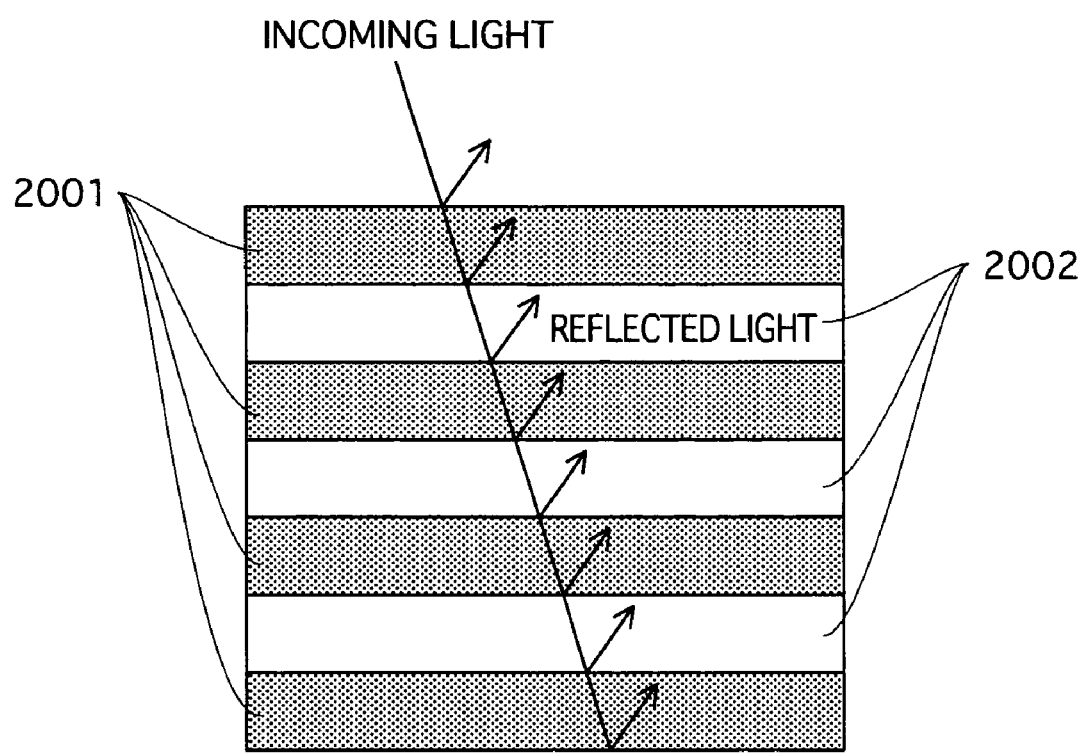
FIG. 29 is a cross-sectional view illustrating a multilayer structure in which a low refractive index material and a high refractive index material alternate with each other, where the both materials are highly transparent to visible light.

To start with, the following describes a multilayer structure in which low refractive index and high refractive index materials are alternately layered. These low refractive index and high refractive index materials are highly transparent for visible light. FIG. 29 is a cross-sectional view illustrating such a multilayer structure. As shown in FIG. 29, a multilayer structure 20 is structured in such a manner that low refractive index layers 2001 and high refractive index layers 2002 are alternately stacked.

Suppose that light enters this multilayer structure 20 in a direction having an angle with respect to the stacking direction of the multilayer structure 20. When the light runs through the layers 2001 and 2002 constituting the multilayer structure 20, the light is reflected at each interface, since the adjacent two layers 2001 and 2002 have different refractive indices. The sum of the amounts of light reflected at all interfaces is equivalent to the amount of light reflected by the entire multilayer structure 20.

If reflected light beams at different interfaces are in phase, the multilayer structure 20 achieves high reflection characteristics. If reflected beams at different interfaces are in opposite phase, the multilayer structure 20 achieves only low reflection characteristics. Therefore, for use as a highly reflective coating film, the multilayer structure 20 is designed so that reflected light beams at interfaces are in phase.

If each of the layers forming such a multilayer structure has the same optical thickness, the multilayer structure reflects wavelengths within a predetermined range (hereinafter referred to as "a reflection range") having a wavelength $\lambda$ as its middle point. Here, the wavelength $\lambda$ is equivalent to four times as long as the optical thickness of each layer, and is hereinafter referred to as a designed center wavelength. This type of multilayer structure is referred to as a $\lambda/4$ multilayer structure.

Figure 30:
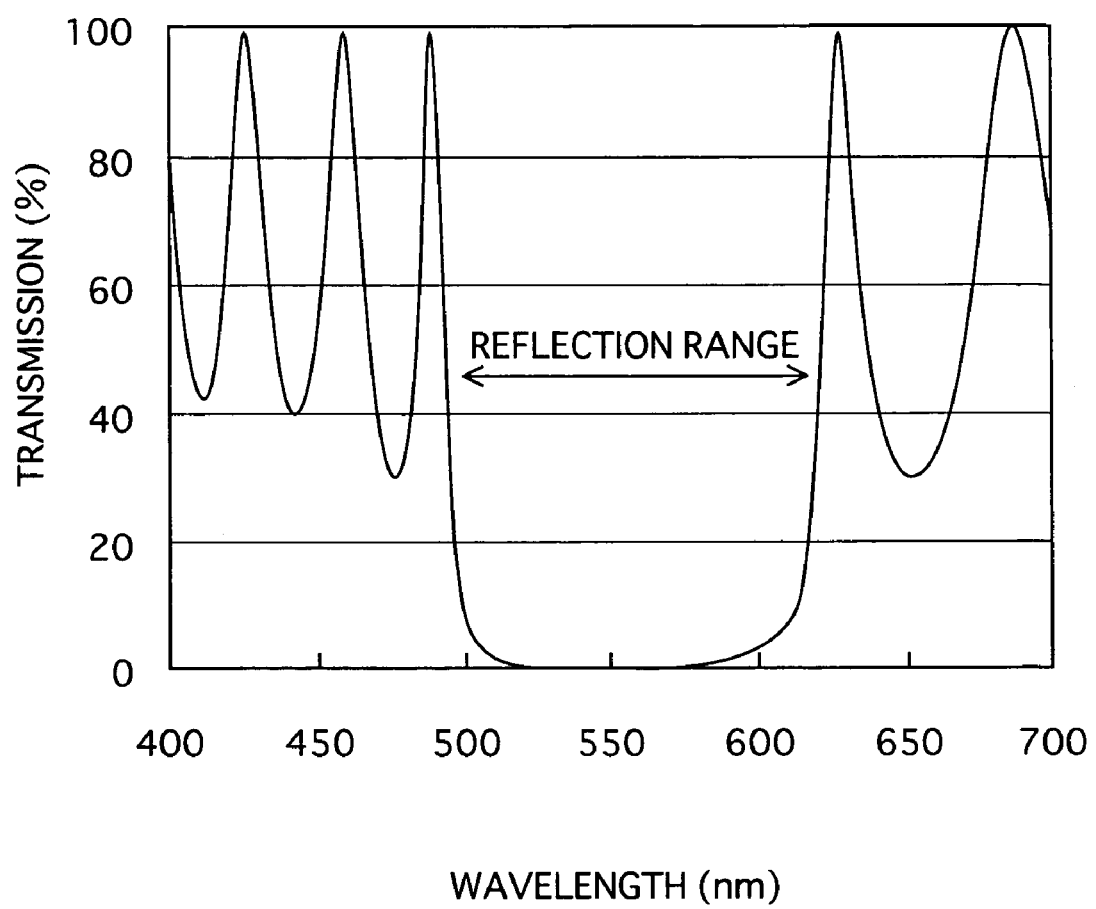
FIG. 30 is a graph illustrating, as an example, transmission characteristics (simulated values) of a $\lambda/4$ multilayer film.

FIG. 30 is a graph illustrating, as an example, the transmission characteristics (simulated values) of a $\lambda/4$ multilayer structure. In FIG. 30, a wavelength of light which enters the $\lambda/4$ multilayer structure is plotted along the horizontal axis, and a transmittance for each wavelength is plotted along the vertical axis. Here, the designed center wavelength $\lambda$ is 550 nm, and the number of pairs of low refractive index and high refractive index layers is ten. The low refractive index layers are made of silicon oxide, and the high refractive index layers are made of silicon nitride. As shown in FIG. 30, the transmittance is significantly low within the reflection range having the designed center wavelength 550 nm as its middle point, i.e. from 500 nm to 600 nm. This indicates that the reflection range of incoming light is reflected substantially 100%.

As described above, the reflection range of a $\lambda/4$ multilayer structure can be freely determined, by varying the optical thickness of each layer. In addition, the reflection range can be widened by increasing the difference in refractive index between low refractive index and high refractive index layers, or by increasing the number of pairs of low refractive index and high refractive index layers.

INDUSTRIAL APPLICABILITY

The present invention provides a solid-state imaging device, a manufacturing method of a solid-state imaging device, and a camera using the same, which are applicable to achieve a color solid-state imaging device having improved performance and a smaller size.

The invention claimed is:

1. A solid-state imaging device comprising:
    a first filter unit having a first bandpass wavelength,
    the first filter unit including a first upper $\lambda/4$ multilayer film, a first lower $\lambda/4$ multilayer film and a first insulation film sandwiched between the first upper $\lambda/4$ multilayer film and the first lower $\lambda/4$ multilayer film,
    a second filter unit having a second bandpass wavelength different from the first bandpass wavelength,
    the second filter unit including a second upper $\lambda/4$ multilayer film, a second lower $\lambda/4$ multilayer film and a second insulation film sandwiched between the second upper $\lambda/4$ multilayer film and the second lower $\lambda/4$ multilayer film,
    wherein the optical thickness of the first insulation film is different from the one of the second insulation film,
    the upper $\lambda/4$ multilayer film and the lower $\lambda/4$ multilayer film of a first filter unit and the second filter unit have substantially the same center wavelength,
    each upper $\lambda/4$ multilayer film and lower $\lambda/4$ multilayer film includes: a first dielectric layer made of a material having a different refractive index from a material forming the first insulation film; and a second dielectric layer made of a material having a substantially same refractive index as the material forming the second insulation film,
    the first dielectric layer is formed so as to be in contact with a main surface of the first insulation film, and the second dielectric layer is formed so as to be in contact with a main surface of the first dielectric layer which faces away from the second insulation film,
    each first dielectric layer has substantially a same optical thickness and each second dielectric layer has substantially a same optical thickness, and
    each of the first filter unit and the second filter unit transmits light received by a different light-receiving unit.

2. The solid-state imaging device of claim 1, further including:
    a plurality of light-receiving units provided in a semiconductor substrate two-dimensionally,
    wherein
    each upper and lower $\lambda/4$ multilayer film includes:
    a dielectric layer that is positioned most distant from the light-receiving unit being made of a low refraction index material.

3. The solid-state imaging device of claim 2, wherein the protective layer is made of silicon nitride.

4. The solid state-imaging device of claim 2, further including:
    a light-collecting unit collecting the incoming light, wherein a portion of the filter unit corresponding to each of the plurality of light-receiving units transmits a wavelength, and a main surface of the filter unit which faces away from the plurality of light-receiving units is flat.

5. The solid-state imaging device of claim 2, wherein a distance between (i) the plurality of light-receiving unit and (ii) a high refraction index layer which is positioned closest to the plurality of light-receiving units, among two or more high refraction index layers in the upper and lower $\lambda/4$ multilayer films, falls within a range of 1 nm and $\lambda$.

6. The solid-state imaging device of claim 1, further including:

a protective layer being provided on one of main surfaces of the upper $\lambda/4$ multilayer films, or within the upper $\lambda/4$ multilayer films.

* * * * *